United States Patent
Takeno et al.

(10) Patent No.: US 12,184,282 B2
(45) Date of Patent: Dec. 31, 2024

(54) SEMICONDUCTOR DEVICE

(71) Applicant: Socionext Inc., Kanagawa (JP)

(72) Inventors: Hirotaka Takeno, Yokohama (JP); Atsushi Okamoto, Yokohama (JP); Wenzhen Wang, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 442 days.

(21) Appl. No.: 17/724,247

(22) Filed: Apr. 19, 2022

(65) Prior Publication Data

US 2022/0239297 A1 Jul. 28, 2022

Related U.S. Application Data

(63) Continuation of application No. PCT/JP2019/042004, filed on Oct. 25, 2019.

(51) Int. Cl.
| | |
|---|---|
| *H03K 19/173* | (2006.01) |
| *H01L 23/495* | (2006.01) |
| *H01L 23/528* | (2006.01) |
| *H01L 29/78* | (2006.01) |

(52) U.S. Cl.
CPC ... *H03K 19/1735* (2013.01); *H01L 23/49562* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,530,273 B2 | 9/2013 | den Boer | |
| 9,754,923 B1 | 9/2017 | Xie et al. | |
| 10,082,820 B1 | 9/2018 | Kihara | |
| 10,950,546 B1 | 3/2021 | Doornbos | |
| 11,004,789 B2 | 5/2021 | Doornbos et al. | |
| 2011/0175646 A1 | 7/2011 | Takemura et al. | |

(Continued)

FOREIGN PATENT DOCUMENTS

| | | |
|---|---|---|
| JP | S53-026689 A | 3/1978 |
| JP | H05-206420 A | 8/1993 |

(Continued)

OTHER PUBLICATIONS

International Search Report issued in corresponding International Application No. PCT/JP2019/042004, dated Nov. 19, 2019 w/English Translation.

*Primary Examiner* — Anh Q Tran

(74) *Attorney, Agent, or Firm* — Rimon P.C.

(57) ABSTRACT

A semiconductor device has: a first chip having a substrate and a first wiring layer; and a second wiring layer formed on a second surface of the substrate. The second wiring layer has a first power supply line, and a second power supply line. The first chip has a first ground line, a third power supply line, a fourth power supply line, vias formed in the substrate and connecting the first power supply line and the third power supply line, a first area in which the first ground line and the fourth power supply line are arranged, and a first circuit connected between the first ground line and the third power supply line. A switch is connected between the first power supply line and the second power supply line. In a plan view, the third power supply line, the vias, and the first circuit are arranged in the first area.

17 Claims, 34 Drawing Sheets

(56) References Cited

U.S. PATENT DOCUMENTS

| | | |
|---|---|---|
| 2012/0032730 A1 | 2/2012 | Koyama |
| 2012/0229190 A1* | 9/2012 | Kajihara ............ H01L 27/0207 |
| | | 327/419 |
| 2013/0300462 A1 | 11/2013 | Koyama et al. |
| 2015/0162448 A1 | 6/2015 | Raghavan et al. |
| 2015/0187642 A1 | 7/2015 | Batra et al. |
| 2018/0145030 A1 | 5/2018 | Beyne et al. |
| 2021/0082815 A1* | 3/2021 | Doornbos ........... H01L 23/5286 |
| 2021/0098361 A1* | 4/2021 | Doornbos ........... H01L 27/0688 |

FOREIGN PATENT DOCUMENTS

| | | |
|---|---|---|
| JP | H11-102910 A | 4/1999 |
| JP | 2009-302198 A | 12/2009 |
| JP | 2011-172214 A | 9/2011 |
| JP | 2012-044042 A | 3/2012 |
| JP | 2013-012749 A | 1/2013 |
| JP | 2014-165358 A | 9/2014 |
| JP | 2018-107463 A | 7/2018 |
| JP | 2019-045891 A | 3/2019 |

* cited by examiner

FIG.11
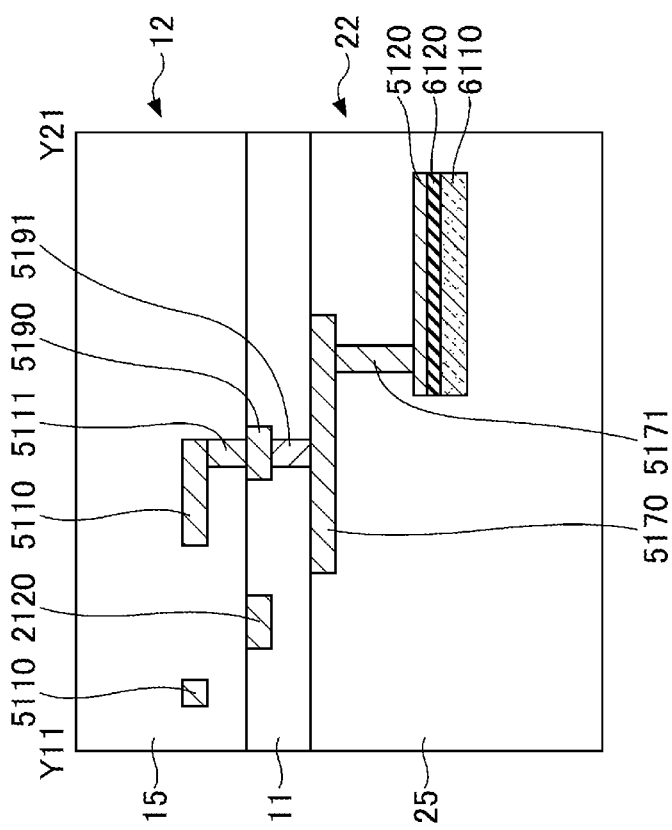
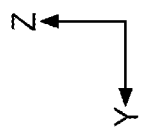

SEMICONDUCTOR DEVICE

CROSS-REFERENCE TO RELATED APPLICATIONS

This application is a continuation of International Application No. PCT/JP2019/042004, filed on Oct. 25, 2019 and designating the U.S., the entire contents of which Application is incorporated herein by reference.

BACKGROUND OF THE INVENTION

1. Field of the Invention

The disclosures herein relate to semiconductor devices.

2. Description of the Related Art

The semiconductor device contains various circuit areas, and one example of the circuit areas is a standard cell area. The standard cell area contains various logic circuits. When a power supply potential of a VDD is supplied to the semiconductor device, the logic circuits in the standard cell area are supplied with a power supply potential of a VVDD and a power switch circuit may be connected between a VDD power supply line and a VVDD power supply line.

The power switch circuit turns on and off the supply of the power supply potential of the VVDD to transistors of the logic circuits. By using the power switch circuit, the power supply is turned off when the logic circuits are not to be operated, thereby allowing to suppress leakage current generated by the transistors that constitute the logic circuits and to reduce power consumption.

A technology has also been proposed in which a subordinate semiconductor chip including wirings is attached to a backside of a main semiconductor chip, and the power supply potential is supplied to the transistors of the main semiconductor chip through the wiring of the subordinate semiconductor chip. Such a technology is sometimes referred to as a backside-power delivery network (BS-PDN).

Technical Problem

So far, there has been no detailed study of any specific configuration of supplying the power supply potential from the subordinate semiconductor chip to a circuit to which the power supply potential of the VDD is supplied, in a configuration in which the standard cell area to which the power supply potential of the VVDD is supplied contains a buffer or other circuit to which the power supply potential of VDD is supplied.

It may be desired to provide a semiconductor device capable of efficiently supplying a power supply potential to a circuit.

CITATION LIST

Patent Literature

[PTD 1] U.S. Patent Published Application No. 2015/0162448.
[PTD 2] U.S. Pat. No. 9,754,923
[PTD 3] U.S. Patent Published Application No. 2018/0145030
[PTD 4] U.S. Pat. No. 8,530,273
[PTD 5] Japanese Patent No. 6469269
[PTD 6] Japanese Patent No. 5358727
[PTD 7] Japanese Patent No. 5660902
[PTD 8] Japanese Patent No. 6389937

SUMMARY OF THE INVENTION

A semiconductor device according to the disclosed technology includes a first chip having a substrate and a first wiring layer formed on a first surface of the substrate, and a second wiring layer formed on a second surface of the substrate opposite to the first surface of the substrate, wherein the second wiring layer includes a first power supply line to which a first power supply potential is supplied, and a second power supply line to which a second power supply potential is supplied, wherein the first chip includes a first ground line, a third power supply line to which the first power supply potential is supplied, a fourth power supply line to which the second power supply potential is supplied, one or more vias formed in the substrate and connecting the first power supply line and the third power supply line, a first area in which the first ground line and the fourth power supply line are arranged, and a first circuit connected between the first ground line and the third power supply line, wherein a switch is connected between the first power supply line and the second power supply line, and wherein, in a plan view, the third power supply line, the one or more vias, and the first circuit are arranged in the first area.

According to the disclosed technology, a power supply potential can be efficiently supplied to the circuit.

BRIEF DESCRIPTION OF THE DRAWINGS

FIG. 11 is a cross-sectional view (2) of a semiconductor device according to the first embodiment;

DESCRIPTION OF THE PREFERRED EMBODIMENTS

Embodiments are described in detail below with reference to the accompanying drawings. In this specification and the drawings, repeated explanations may be omitted by appending the same sign to components having substantially the same functional configuration. In the following description, two directions parallel to a surface of a substrate and orthogonal to each other are referred to as an X direction and a Y direction, and a direction perpendicular to the surface of the substrate is referred to as a Z direction. The conformity of the arrangement in the present disclosure does not strictly exclude unconformity caused by manufacturing variations, and even when there is a misalignment in the arrangement due to manufacturing variations, the arrangement can be regarded as conformable.

(Overview of a Semiconductor Device to which the Present Disclosure Applies)

Figure 1:
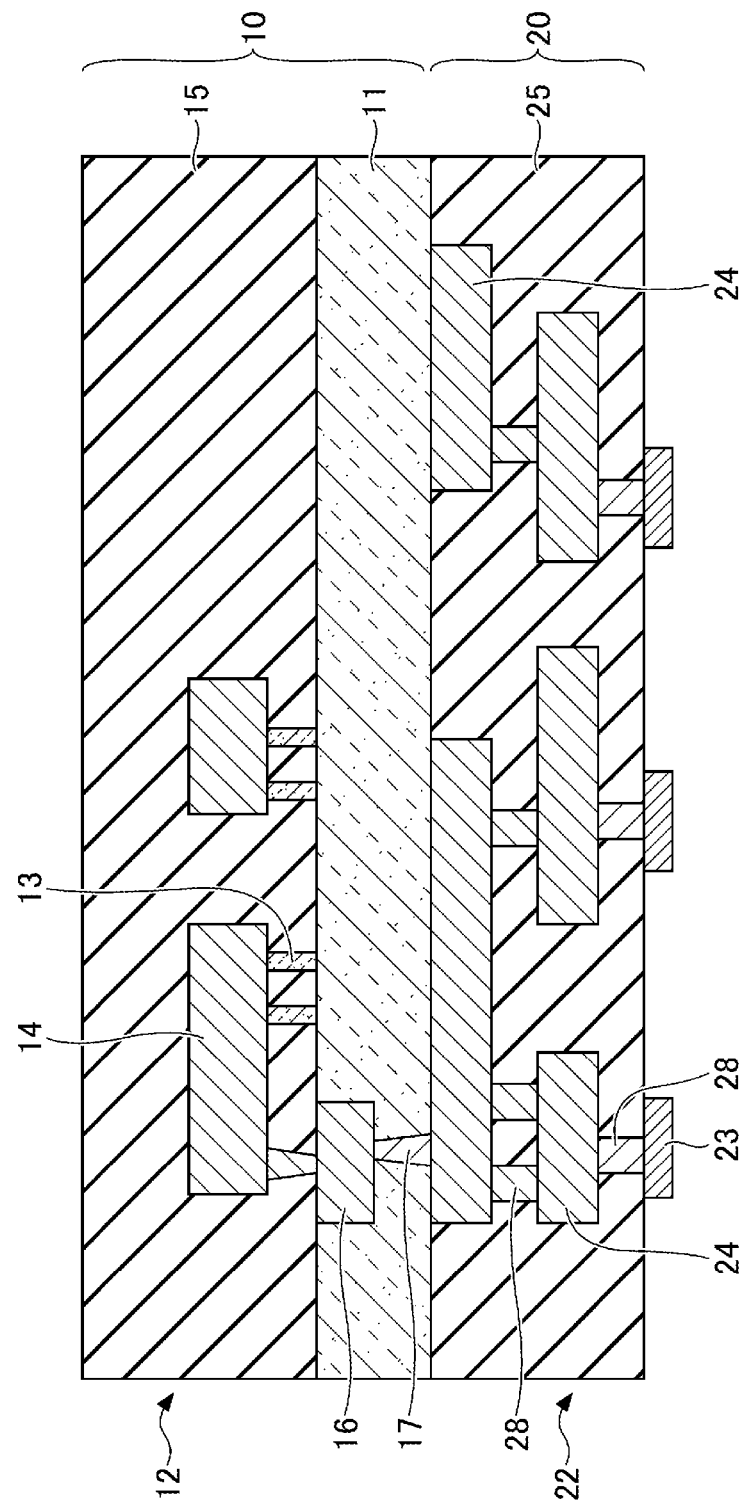
FIG. 1 is a cross-sectional view showing an overview of a semiconductor device to which the present disclosure is applied.

First, an overview of a semiconductor device to which the present disclosure applies will be described. FIG. 1 is a cross-sectional view showing an overview of a semiconductor device to which the present disclosure applies. The semiconductor device shown in FIG. 1 includes a first chip 10 and a second chip 20.

The first chip 10 is, for example, a semiconductor chip, and includes a substrate 11 and a first wiring layer 12. The substrate 11 is, for example, a silicon substrate, and a semiconductor element such as a transistor is formed on a front surface side of the substrate 11. The transistor is, for example, a FinFET that includes one or more fins 13 in a source, a drain, and a channel. The first wiring layer 12 is formed on a front surface of the substrate 11 and includes a wiring 14 and an insulating layer 15. A part of the wiring 14 is connected to the one or more fins 13. Furthermore, for example, on a front surface side of the substrate 11, a power supply line 16 connected to the wiring 14 is formed, and the substrate 11 is provided with a via 17 that reaches from the power supply line 16 to a back surface of the substrate 11. The via 17 is, for example, a through-silicon via (TSV). As shown in FIG. 1, a part of the wiring 14 may have a via-like shape and be connected to the power supply line 16.

A second chip 20 is, for example, a semiconductor chip and is arranged so as to face the back surface of the substrate 11 of the first chip 10. The second chip 20 includes, for example, a second wiring layer 22 and pads 23. The second wiring layer 22 includes a wiring 24 and an insulating layer 25. A top surface of the second wiring layer 22 faces, for example, the back surface of the substrate 11 of the first chip 10. That is, the substrate 11 is located between the first wiring layer 12 and the second wiring layer 22. The second wiring layer 22 may have a plurality of the wirings 24, as shown in FIG. 1. The plurality of wirings 24 may be connected through vias 28 provided in the second wiring layer 22. The pads 23 are external connection terminals that are connected to, for example, a wiring substrate, a board, and the like. A part of the wirings 24 is connected to the via 17. The pads 23 are provided on a back surface of the second wiring layer 22 and are connected to the wirings 24 through the vias 28. A power supply potential is supplied and signals are transmitted to the second wiring layer 22 through the pads 23.

The second chip 20 may have approximately the same size as the first chip 10, or may have a larger size than the first chip 10. The pads 23 may be provided outside the first chip 10 in a plan view on a surface of the second chip 20 on a side facing the first chip 10. Hereafter, in this specification, a plan view refers to a plan view of the main surface of the first chip 10.

The second wiring layer 22 may be provided by forming the wirings 24, the insulating layer 25, and the like on the back surface of the substrate 11. The second wiring layer 22 may be formed on a second substrate on which TSVs are formed, and the pads 23 may be provided on a back surface of the second substrate.

Figure 10:
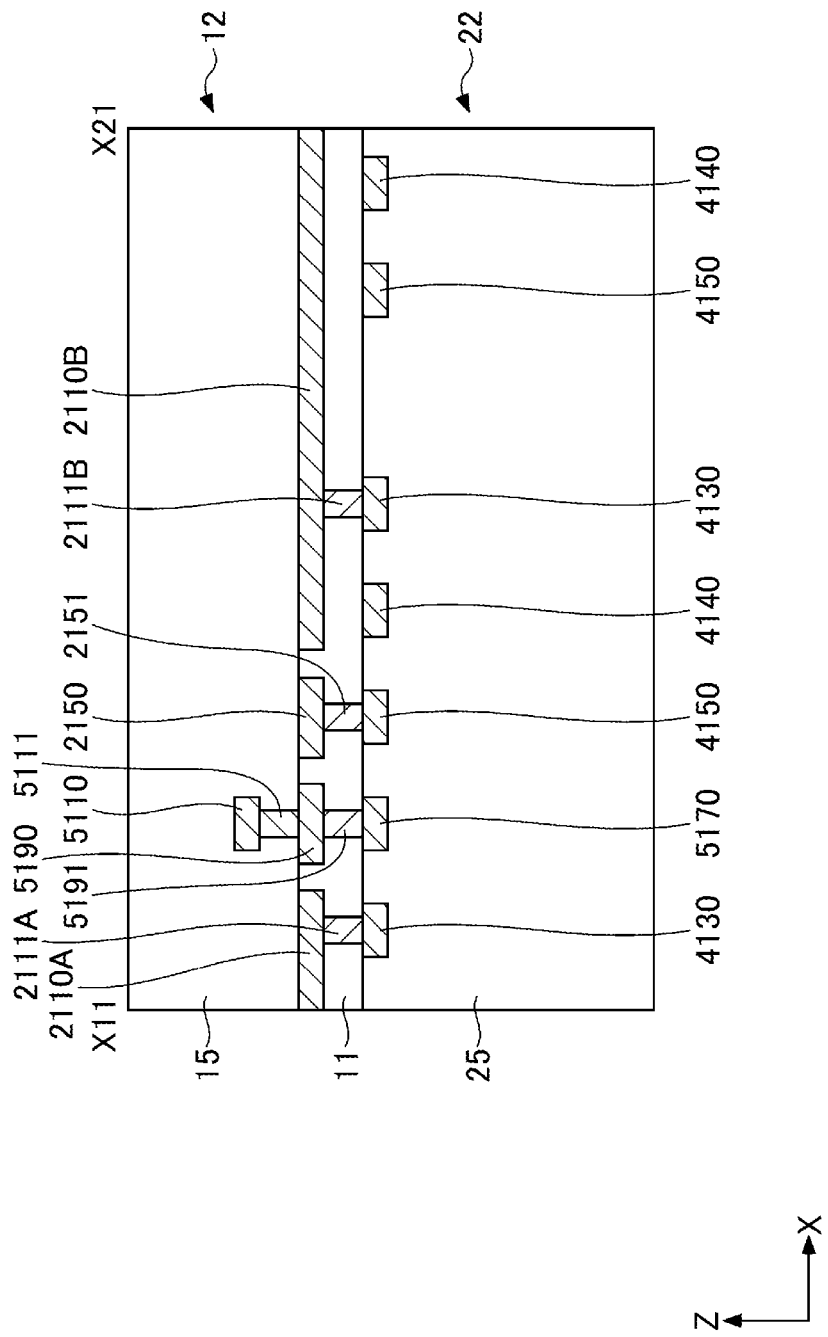
FIG. 10 is a cross-sectional view (1) of a semiconductor device according to the first embodiment.

The cross-sectional view shown in FIG. 1 is an overview of the semiconductor device, and details are shown in FIGS. 10, 11, and the like.

Figure 2:
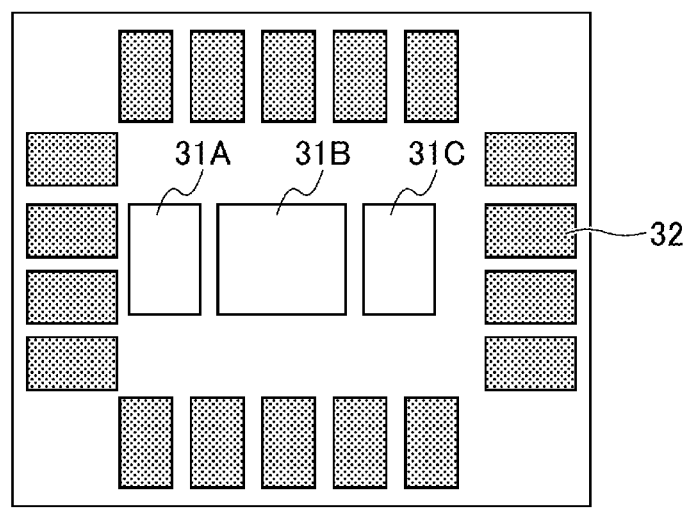
FIG. 2 is a drawing of a layout of a first chip.

Next, a layout of the first chip 10 will be described. FIG. 2 is a drawing showing a layout of the first chip 10.

As shown in FIG. 2, the first chip 10 includes a first power domain 31A, a second power domain 31B, a third power domain 31C, and input/output (I/O) cell areas 32. The I/O cell areas 32 are arranged, for example, around the first power domain 31A and the second power domain 31B. The number of the first power domains 31A, the number of the second power domains 31B, and the number of the third power domains 31C may be two or more.

[Circuits Included in Semiconductor Device]

Figure 3:
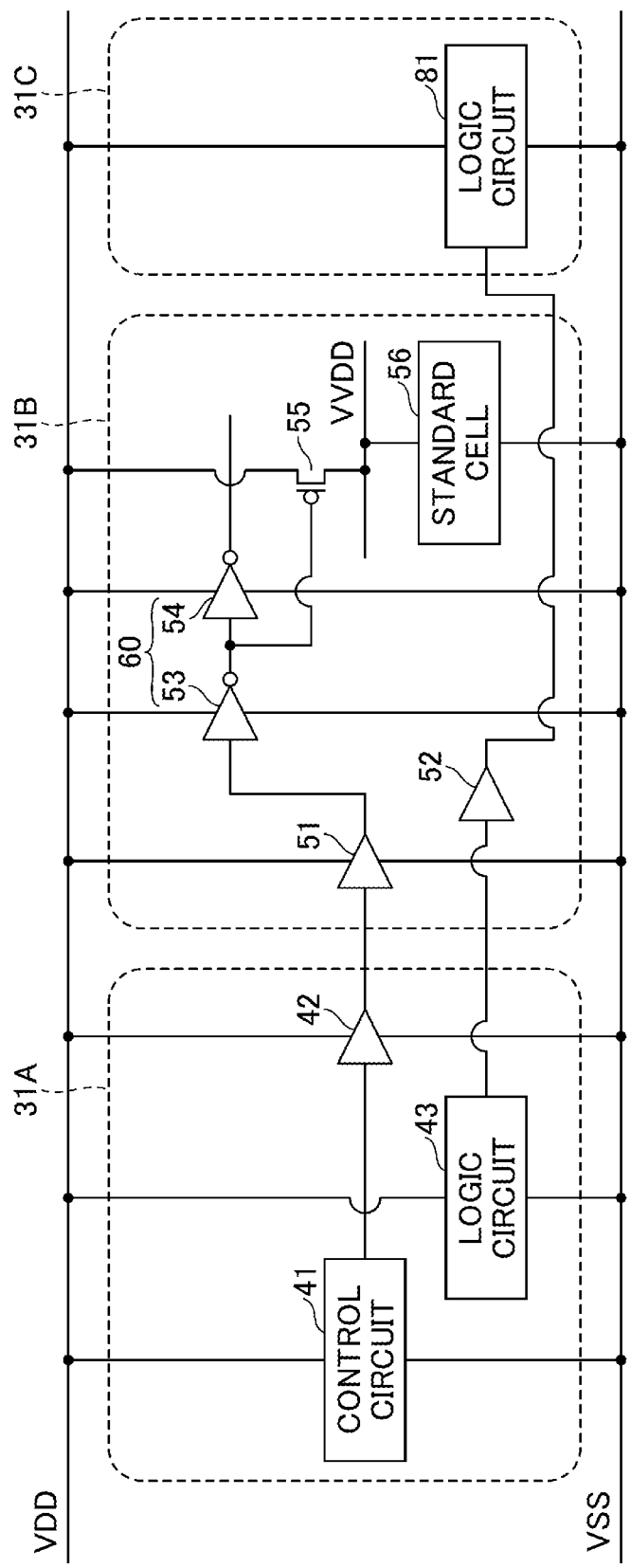
FIG. 3 is a circuit diagram of a configuration of an example of a circuit included in the semiconductor device.

Next, circuits included in the semiconductor device will be described. FIG. 3 is a circuit diagram showing configuration of an example of a circuit included in the semiconductor device.

As shown in FIG. 3, the semiconductor device has a control circuit 41, a buffer 42, and a logic circuit 43 in the first power domain 31A. The semiconductor device has a buffer 51, a buffer 52, an inverter 53, an inverter 54, and a standard cell 56 in the second power domain 31B. The semiconductor device has a logic circuit 81 in the third power domain 31C. The semiconductor device has a VDD wiring to which a power supply potential of a VDD is supplied and a VVDD wiring to which a power supply potential of a VVDD is supplied, and a VSS wiring to which a ground potential of a VSS is supplied.

The control circuit 41, the buffer 42, and the logic circuit 43 in the first power domain 31A are supplied with the power supply potential of the VDD and the ground potential of the VSS. For example, an output signal of the control circuit 41 is input to the buffer 42. The logic circuit 43 may operate independently of the control circuit 41 and the buffer 42.

The power supply potential of the VDD and the ground potential of the VSS are supplied to the buffer 51, the buffer 52, the inverter 53, and the inverter 54 in the second power domain 31B. For example, an output signal of the buffer 42 is input to the buffer 51, an output signal of the buffer 51 is input to the inverter 53, and an output signal of the inverter 53 is input to the inverter 54. The inverters 53 and 54 can constitute a single buffer 60. An output signal of the logic circuit 43 is input to the buffer 52. The buffer 52 can operate independently of the buffer 51, the inverter 53, and the inverter 54.

As will be described in detail below, in a plan view of the main surface of the first chip 10, the semiconductor device has a switch transistor 55 in an area overlapping the second power domain 31B of the second wiring layer 22. In FIG. 3, for convenience, the switch transistor 55 is illustrated in the second power domain 31B, but the switch transistor 55 may be provided outside the second power domain 31B. The switch transistor 55 is, for example, a P-channel MOS transistor. For example, the output signal of the inverter 53 is input to a gate of the switch transistor 55. A source (a VDD connection) of the switch transistor 55 is connected to the VDD wiring, and a drain (a VVDD connection) is connected to the VVDD wiring. The operation of the switch transistor 55 is controlled by the control circuit 41 through the buffer 42 and the like. The control circuit 41 switches on and off the switch transistor 55 and controls conduction between the VDD wiring and the VVDD wiring. The input signal of the inverter 53, that is, the output signal of the buffer 51, may be input to the gate of the switch transistor 55, and the output signal of the inverter 54 may be input to the gate of the switch transistor 55. The switch transistor 55 may consist of a thin film transistor (TFT) and may be a microelectromechanical systems (MEMS) switch.

The power supply potential of the VVDD and the ground potential of the VSS are supplied to the standard cell 56 in the second power domain 31B. The standard cell 56 includes various logic circuits, such as a NAND circuit, an inverter, and the like. A static random-access memory (SRAM) and a macro may be included in the standard cell 56.

The power supply potential of the VDD and the ground potential of the VSS are supplied to the logic circuit 81 in the third power domain 31C. For example, the output signal of the buffer 52 is input to the logic circuit 81. The logic circuit 81 can be provided in the first power domain 31A, for example, instead of the third power domain 31C.

[Buffer 60]

Figure 4:
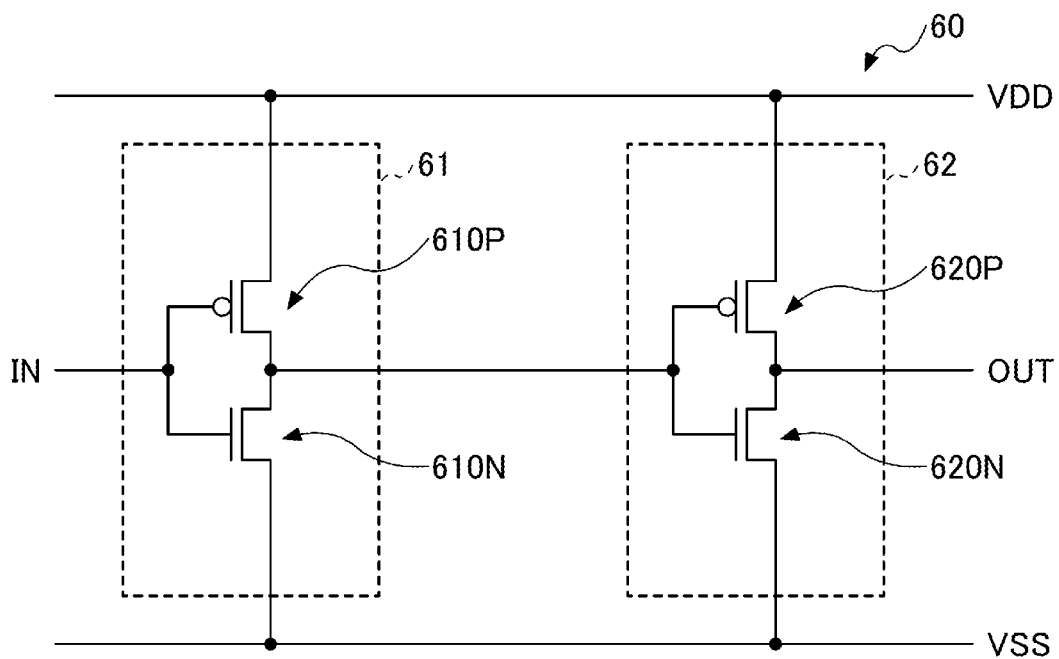
FIG. 4 is a circuit diagram showing a configuration of a buffer.
Figure 5:
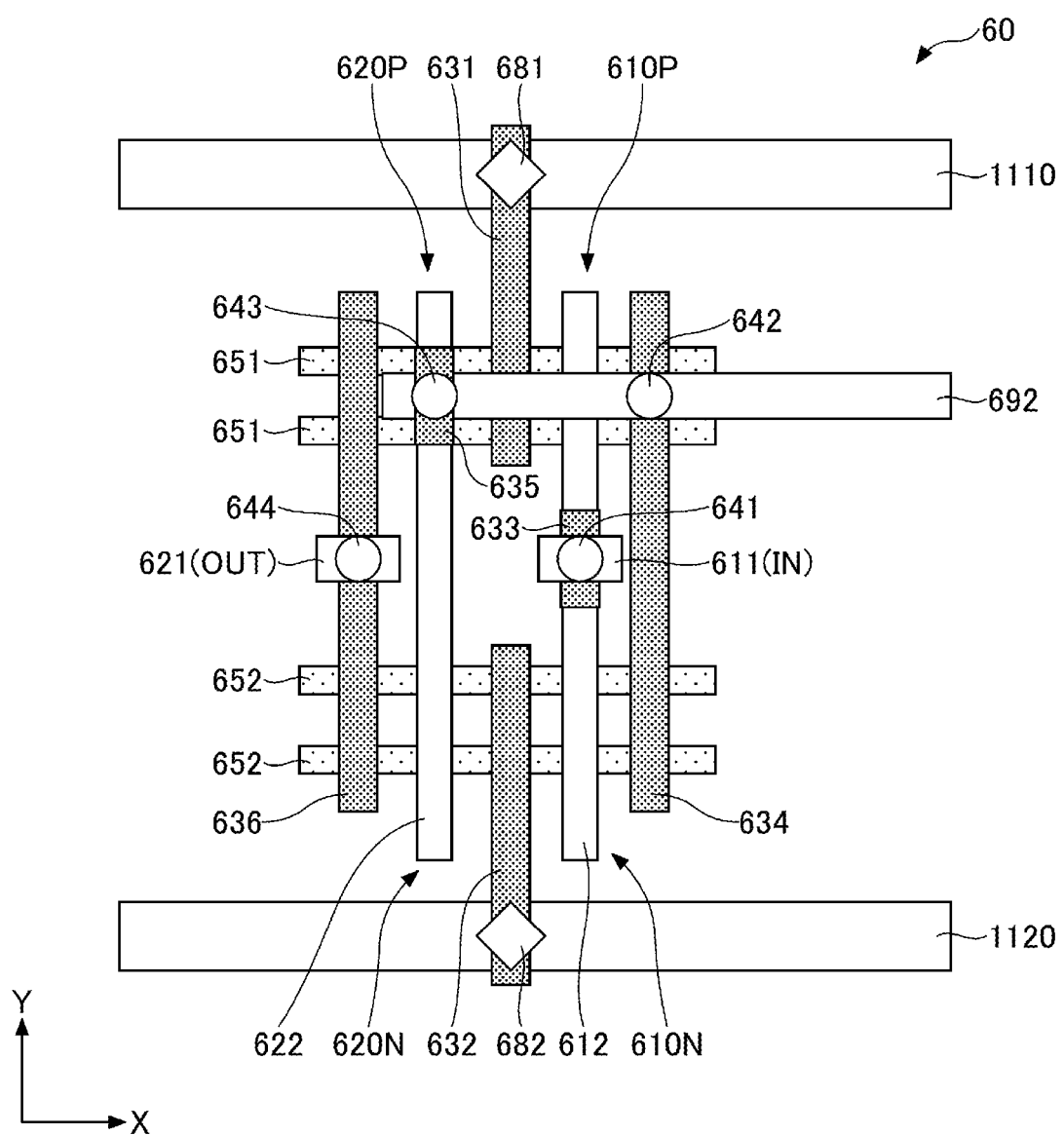
FIG. 5 is a schematic diagram of a planar configuration of a first example of a buffer.
Figure 6:
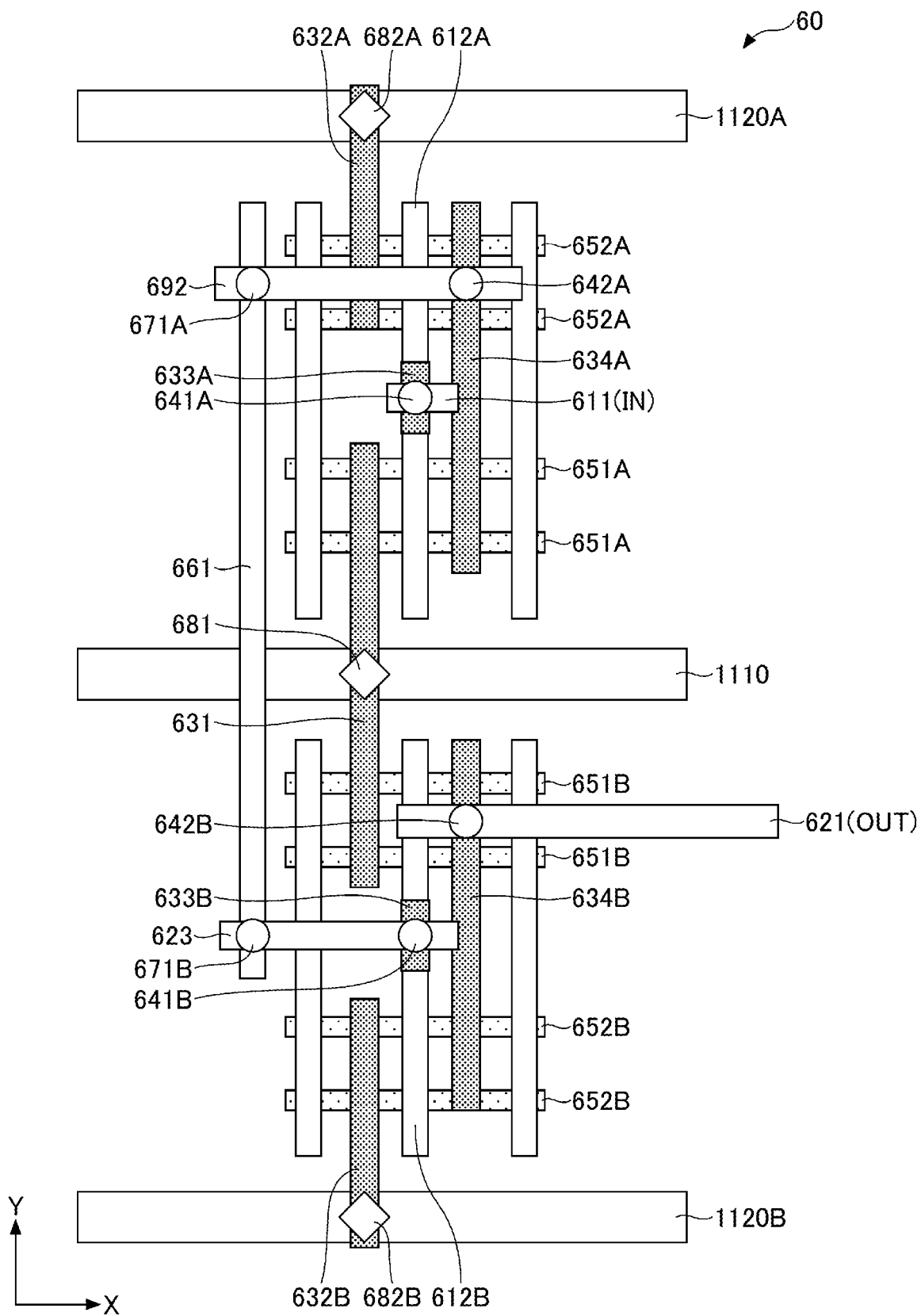
FIG. 6 is a schematic diagram of a planar configuration of a second example of a buffer.

Next, a configuration of the buffer 60 to which the VDD power supply potential and the VSS power supply potential are supplied, will be described. Here, two examples are described. FIG. 4 is a circuit diagram showing a configuration of the buffer 60. FIG. 5 is a schematic diagram of a planar configuration of a first example of the buffer 60. FIG. 6 is a schematic diagram of the planar configuration of a second example of the buffer 60.

As shown in FIG. 4, the buffer 60 has an inverter 61 and an inverter 62. An input signal IN is input to the inverter 61, an output of the inverter 61 is input to the inverter 62, and an output signal OUT is output from the inverter 62. The inverter 61 includes a P-channel MOS transistor 610P and a N-channel MOS transistor 610N. The inverter 62 includes a P-channel MOS transistor 620P and a N-channel MOS transistor 620N.

In a first example of the buffer 60, for example, as shown in FIG. 5, a power supply line 1110 corresponding to the VDD wiring and a power supply line 1120 corresponding to the VSS wiring are provided. The power supply line 1110 and the power supply line 1120 extend in the X direction. On a side of the power supply line 1110 that faces the power supply line 1120, fins 651 of a semiconductor extending in the X direction are provided. For example, two fins 651 are provided. A local wiring 631 connected to the power supply line 1110 through a via 681, extending in the Y direction, and connected to the fins 651, is provided. A local wiring 632 connected to the power supply line 1120 through a via 682, extending in the Y direction, and connected to the fins 652, is provided. On a positive side in the X direction from the local wiring 631 and 632, a local wiring 634 is provided that is connected to the fins 651 and 652. On the negative side in the X direction from the local wiring 631 and 632, a local wiring 636 is provided that is connected to the fins 651 and 652.

A gate electrode 612 intersecting the fins 651 and 652 through a gate insulating film (not shown) is provided between the local wiring 631 and the local wiring 634, and between the local wiring 632 and the local wiring 634. A gate electrode 622 intersecting the fins 651 and 652 through a gate insulating film (not shown) is provided between the local wiring 631 and the local wiring 636, and between the local wiring 632 and the local wiring 636. The gate electrode 612 is connected to a wiring 611 through a local wiring 633 and a via 641. The gate electrode 622 is connected to a wiring 692 through a local wiring 635 and a via 643. The wiring 692 is also connected to the local wiring 634. The local wiring 636 is connected to a wiring 621 through a via 644. An input signal IN is input to the wiring 611, and an output signal OUT is output from the wiring 621 (See FIG. 4).

The wiring 692 may be connected to the gate of the switch transistor 55. Instead of the wiring 692, either one of the wiring 611 or the wiring 621 may be connected to the gate of the switch transistor 55.

In a second example of the buffer 60, for example, as shown in FIG. 6, the power supply line 1110 corresponding to the VDD wiring, and a power supply line 1120A and a power supply line 1120B, corresponding to the VSS wiring are provided. The power supply lines 1110, 1120A, and 1120B extend in the X direction. The power supply line 1110 is located between the power supply line 1120A and 1120B in the Y direction.

On a side of the power supply line 1110 that faces the power supply line 1120A, fins 651A of a semiconductor extending in the X direction are provided. For example, two fins 651A are provided. On a side of the fins 651A that faces the power supply line 1120A, fins 652A of a semiconductor extending in the X direction are provided. For example, two fins 652A are provided. On a side of the power supply line 1110 that faces the power supply line 1120B, fins 651B of the semiconductor extending in the X direction are provided. For example, two fins 651A are provided. On a side of the fins 651B that faces the power supply line 1120B, fins 652B of the semiconductor extending in the X direction are provided. For example, two fins 652B are provided.

A local wiring 631 connected to the power supply line 1110 through a via 681, extending in the Y direction, and connected to the fins 651A and 651B, is provided. A local wiring 632A connected to the power supply line 1110A through a via 682A, extending in the Y direction, and connected to the fins 652A, is provided. On a positive side in the X direction from the local wiring 631 and 632A, a local wiring 634A is provided that is connected to the fins 651A and 652A. A local wiring 632B connected to the power supply line 1120B through a via 682B, extending in the Y direction, and connected to the fins 652B, is provided. On the positive side in the X direction from the local wirings 631 and 632A, a local wiring 634B is provided that is connected to the fins 651B and 652B.

A gate electrode 612A intersecting the fins 651A and 652B through a gate insulating film (not shown) is provided between the local wiring 631 and the local wiring 634A, and between the local wiring 632A and the local wiring 634A. A gate electrode 612B intersecting the fins 651B and 652B through the gate insulating film (not shown) is provided between the local wiring 631 and the local wiring 634B, and between the local wiring 632B and the local wiring 634B.

The gate electrode 612A is connected to the wiring 611 through a local wiring 633A and a via 641A. The gate electrode 612B is connected to the wiring 623 through a local wiring 633B and a via 641B. A local wiring 634A is connected to a wiring 692 through a via 642A. The wirings 611, 621, 692, and 623 extend in the X direction. On the negative side in the X direction from the local wirings 631, 632A, and 632B, a wiring 661 is provided. The wiring 661 is connected to the wiring 692 through a via 671A, and is connected to the wiring 623 through a via 671B. An input signal IN is input to the wiring 611, and an output signal OUT is output from the wiring 621 (see FIG. 4).

The wirings 692, 623, and 661 may be connected to the gate of the switch transistor 55. The wiring 611 may be connected to the gate of the switch transistor 55. The wiring 621 may be connected to the gate of the switch transistor 55.

For example, for the buffers 42, 51, and 52, a buffer with the same configuration as the buffer 60 can be used. For example, for the inverters 53 and 54, inverters 61 and 62 can be used.

The configuration of the inverters 61 and 62 is an example, and there may be two or more pairs of the P-channel MOS transistor and the N-channel MOS transistor included in the inverters 61 and 62.

Figure 7:
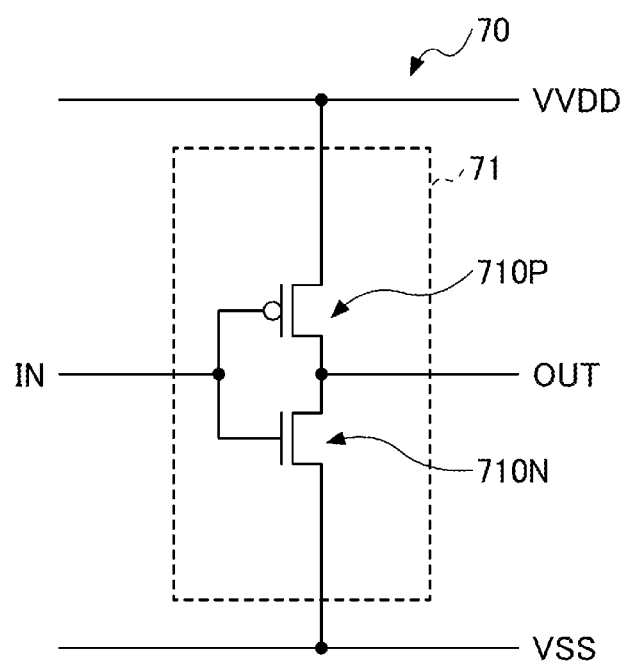
FIG. 7 is a circuit diagram showing a configuration of an inverter.
Figure 8:
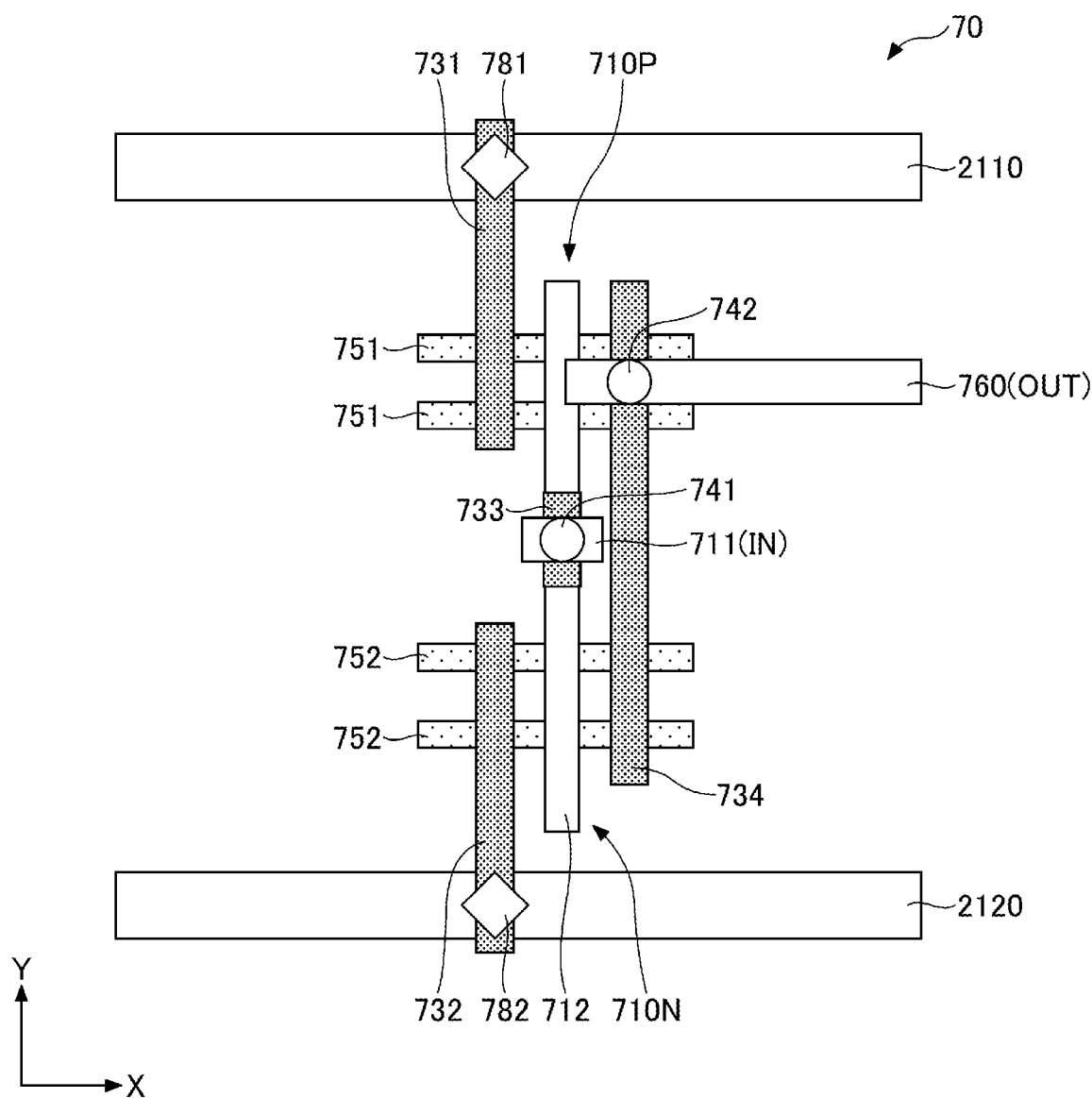
FIG. 8 is a schematic diagram showing a planar configuration of an inverter.

Next, as an example of a circuit included in the standard cell 56, a configuration of an inverter will be described. FIG. 7 is a circuit diagram showing a configuration of an inverter. FIG. 8 is a schematic diagram showing a planar configuration of an inverter.

As shown in FIG. 7, an inverter 70 includes a P-channel MOS transistor 710P and an N-channel MOS transistor 710N.

As shown in FIG. 8, a power supply line 2110 corresponding to the VVDD wiring and a power supply line 2120 corresponding to the VSS wiring are provided. The power supply line 2110 and the power supply line 2120 extend in the X direction. On a side of the power supply line 2110 that faces the power supply line 2120, semiconductor fins 751 extending in the X direction are provided. For example, two fins 751 are provided. On a side of the semiconductor fins 751 that faces the power supply line 2120, semiconductor fins 752 extending in the X direction are provided. For example, two fins 752 are provided. A local wiring 731 connected to the power supply line 2110 through a via 781, extending in the Y direction, and connected to the fins 751, is provided. A local wiring 732 connected to the power supply line 2120 through a via 782, extending in the Y direction, and connected to the fins 752, is provided. On the positive side in the X direction from the local wiring 731 and 732, a local wiring 734 is provided that is connected to the fins 751 and 752. The circuit may be provided over an area with three or more power supply lines 2110 and 2120. That is, a so-called multi-height circuit may be provided.

A gate electrode 712 intersecting the fins 751 and 752 through a gate insulating film (not shown) is provided between the local wiring 731 and the local wiring 743, and between the local wiring 732 and the local wiring 734. The gate electrode 712 is connected to a wiring 711 through a local wiring 733 and a via 741. The local wiring 734 is connected to a wiring 760 through a via 742. An input signal IN is input to the wiring 711, and an output signal OUT is output from the wiring 760 (see FIG. 7).

FIG. 5, FIG. 6, and FIG. 8 show an example of a transistor using fins (FinFET). However, planar transistors, Complementary Field Effect Transistors (CFETs), nanowire-based transistors, and the like may be provided in a logic circuit such as a buffer.

First Embodiment

Figure 9:
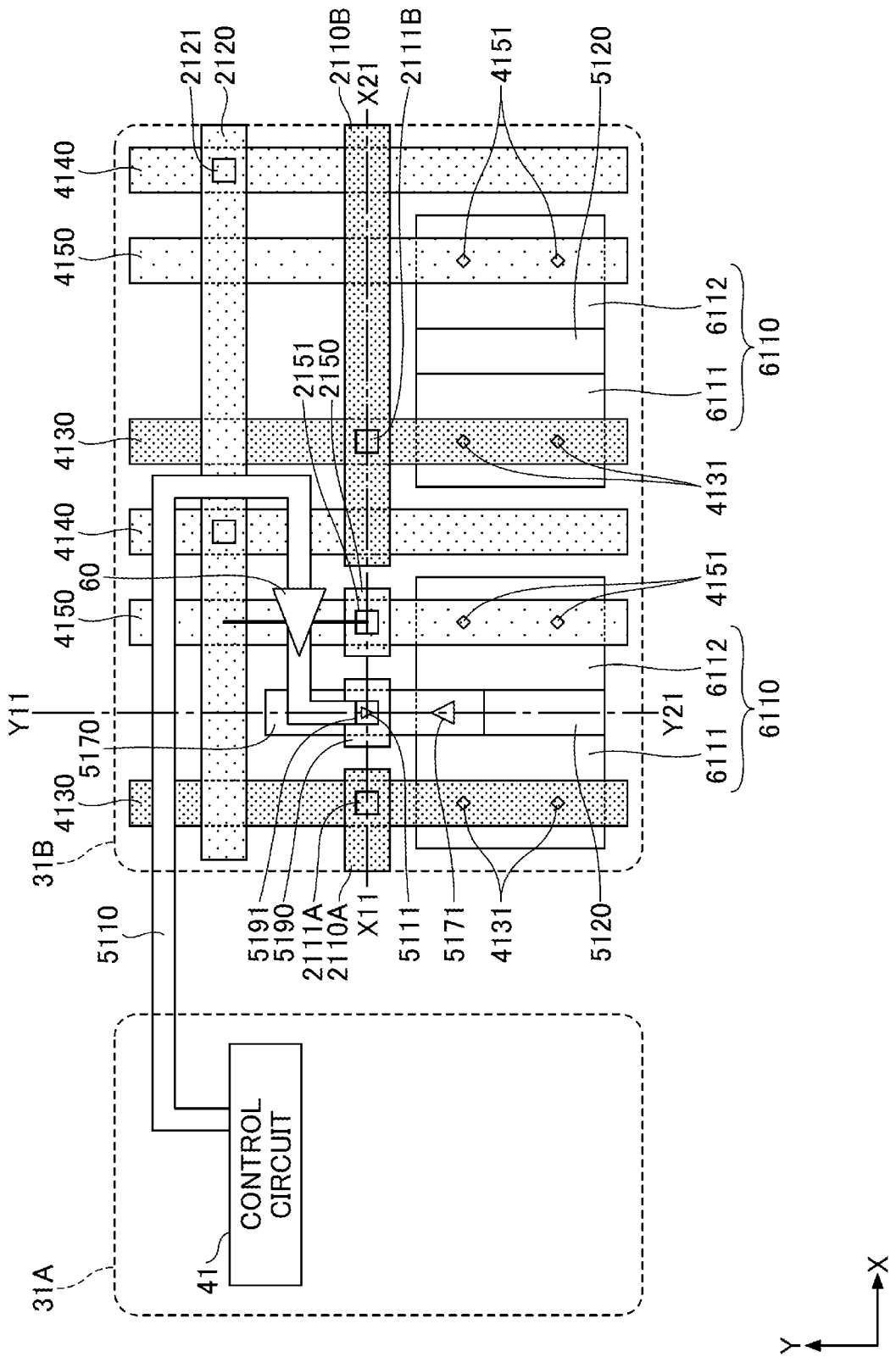
FIG. 9 is a schematic diagram showing a planar configuration of a semiconductor device according to a first embodiment.
Figure 12:
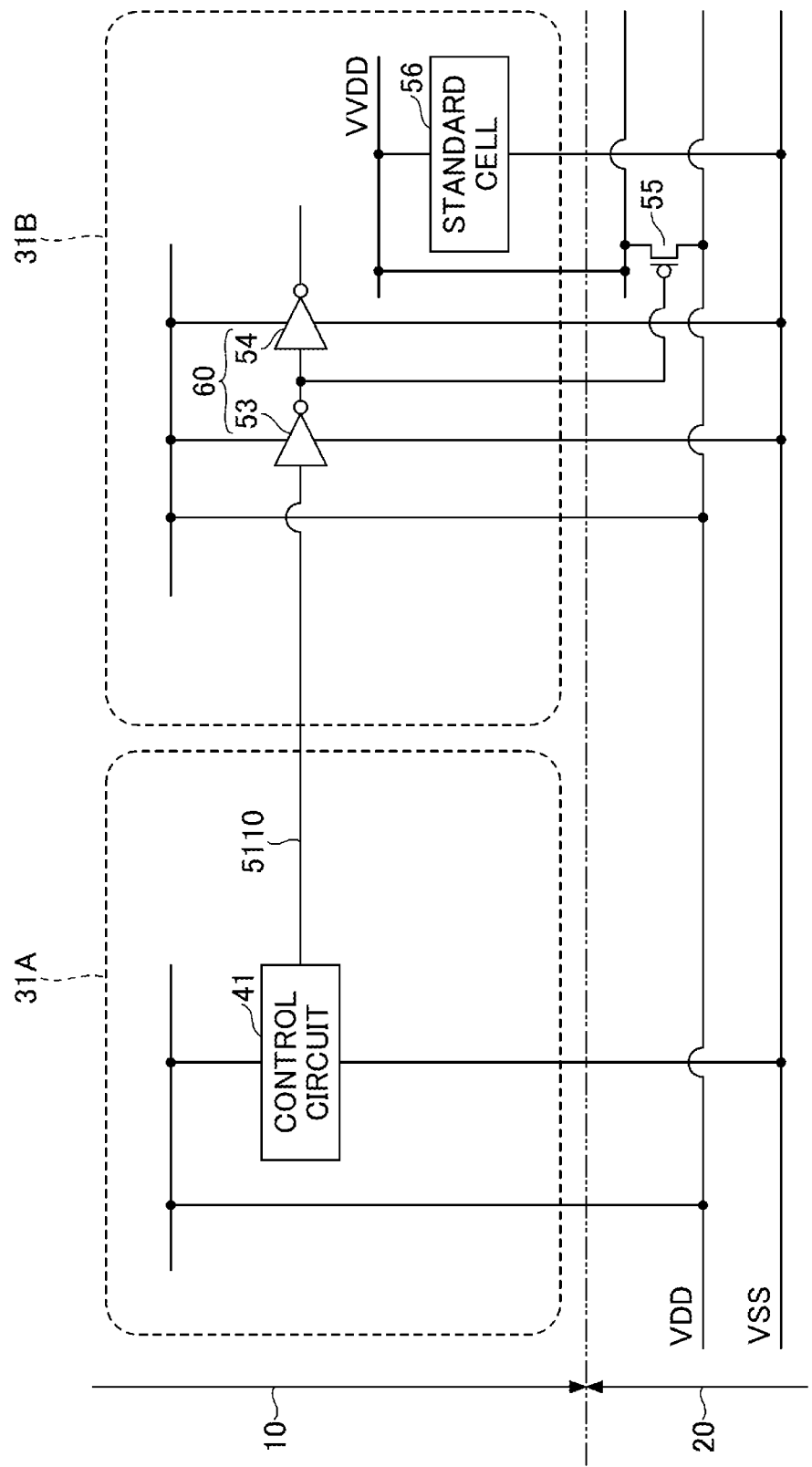
FIG. 12 is an equivalent circuit diagram of parts shown in FIG. 9 to FIG. 11.

A first embodiment will be described. The first embodiment includes, for example, the control circuit 41, the buffer 60, the switch transistor 55 and the standard cell 56 in the circuit shown in FIG. 3. FIG. 9 is a schematic diagram showing a planar configuration of a semiconductor device according to the first embodiment. FIGS. 10 and 11 are cross-sectional views of the semiconductor device according to the first embodiment. FIG. 10 is a cross-sectional view along a line X11-X21 in FIG. 9, and FIG. 11 is a cross-sectional view along a line Y11-Y21 in FIG. 9. FIG. 12 is an equivalent circuit diagram of the parts shown in FIGS. 9 to 11.

[First Power Domain 31A]

The control circuit 41 is provided in the first power domain 31A. The ground potential of the VSS and the power supply potential of a VDD are supplied to the control circuit 41 (see FIG. 3).

[Second Power Domain 31B]

In the second power domain 31B, power supply line strips 2110A and 2110B extending in the X direction and a power supply line 2120 extending in the X direction are arranged in line in the Y direction. The power supply line strips 2110A and 2110B are arranged on an identical straight line extending in the X direction with a gap therebetween. A power supply line 2150 extending in the X direction and a connection 5190 extending in the X direction are arranged between the power supply line strip 2110A and the power supply line strip 2110B. For example, the power supply line strips 2110A and 2110B correspond to the VVDD wiring, the power supply line 2120 corresponds to the VSS wiring, and the power supply line 2150 corresponds to the VDD wiring. In the following, the power supply line strips 2110A, 2110B, and the like corresponding to the VVDD wiring, may be collectively referred to as the power supply line 2110.

As shown in FIGS. 9 to 11, a plurality of grooves extending in the X direction are formed on the substrate 11, and the power supply lines 2110, 2120, 2150, and the connection 5190 are formed in these grooves. The power supply lines 2110, 2120, and 2150 with this structure may be referred to as a Buried Power Rail (BPR). An element separation film (not shown) may be formed on a front surface of the substrate 11.

In the substrate 11, vias 2111A, 2111B, 2121, 2151, and 5191 are formed, which penetrate the substrate 11 to the back surface. The via 2111A is formed under the power supply line strip 2110A, and the via 2111B is formed under the power supply line strip 2110B. The via 2121 is formed under the power supply line 2120, the via 2151 is formed under the power supply line 2150, and the via 5191 is formed under the connection 5190. In the following, the vias such as vias 2111A and 2111B, which are provided under the power supply line 2110 and are connected to the power supply line 2110, are collectively referred to as vias 2111.

The buffer 60 shown in FIG. 5 is connected between the power supply line 2150 and the power supply line 2120. A circuit included in the standard cell 56, such as the inverter 70 shown in FIG. 8, is connected between the power supply line 2110 and the power supply line 2120, but is not illustrated.

[Switch Transistor 55]

As shown in FIGS. 9 to 11, the second chip 20 includes, for example, the insulating layer 25 and power supply lines 4130, 4140, and 4150 formed on a surface layer of the insulating layer 25. The power supply lines 4130, 4140, and 4150 extend in the Y direction. For example, a plurality of the power supply lines 4130, 4150, and 4140 are arranged in this order in the X direction.

The power supply lines 4130, 4140, and 4150 are provided in an area overlapping the second power domain 31B in a plan view. The power supply lines 4130 correspond to the VVDD wiring, the power supply lines 4140 correspond to the VSS wiring, and the power supply lines 4150 correspond to the VDD wiring. Some of the power supply lines 4130 are connected to the power supply line strip 2110A through the via 2111A, and some of the power supply lines 4130 are connected to the power supply line strip 2110B through the via 2111B. The power supply lines 2110 and 4130 may have a mesh structure in a plan view. The power supply lines 4140 are connected to the power supply lines 2120 through the via 2121. The power supply lines 2120 and 4140 may have a mesh structure in a plan view. The power supply line 4150 are connected to the power supply line 2150 through the via 2151.

The second chip 20 includes a control signal line 5170 formed on the surface layer of the insulating layer 25. The control signal line 5170 is located between the power supply line 4130 and the power supply line 4150, between which no power supply line 4140 is interposed. The control signal line 5170 extends in the Y direction. The control signal line 5170 is connected to the connection 5190 through the via 5191.

In the insulating layer 25, a semiconductor layer 6110 is formed that overlaps in a plan view with an adjacent pair of power supply lines 4130 and 4150 without a power supply line 4140 being interposed therebetween. A gate insulating film 6120, which is located between the power supply line 4130 and the power supply line 4150 in a plan view, is formed on the semiconductor layer 6110, and a gate electrode 5120 is formed on the gate insulating film 6120. A via 5171 is formed in the insulating layer 25 to electrically connect the control signal line 5170 to the gate electrode 5120. The via 5171 is formed under the control signal line 5170. In some of the switch transistors 55 in FIG. 9, the via 5171 and the control signal line 5170 are not illustrated. That is, in each of a plurality of the switch transistors 55, the via 5171 and the control signal line 5170 are arranged.

The semiconductor layer 6110 has a VVDD connection 6111 (drain) and a VDD connection 6112 (source), between which the gate electrode 5120 is interposed in the X direction. In the insulating layer 25, a via 4131 that electrically connects the VVDD connection 6111 to the power supply line 4130, and a via 4151 that electrically connects the VDD connection 6112 to the power supply line 4150 are formed. The gate electrode 5120 functions as the gate of the switch transistor 55, the VDD connection 6112 functions as the source of the switch transistor 55, and the VVDD connection 6111 functions as the drain of the switch transistor 55. The switch transistor 55 is electrically connected between the power supply line 4150 corresponding to the VDD wiring, and the power supply line 4130 corresponding to the VVDD wiring.

[Buffer 60]

As described above, the buffer 60 is connected between the power supply line 2150 and the power supply line 2120. An output signal from the control circuit 41 is input to the buffer 60 and an output signal from the buffer 60 is input to the gate of the switch transistor 55. That is, on and off of the switch transistor 55 is controlled by the control circuit 41 through the buffer 60. The standard cell 56 arranged in the second power domain 31B is also connected to the power supply line 2120. The power supply line 2150 is connected to the power supply line 4150 through the via 2151 formed in the substrate 11. The power supply line 4150 is connected to the VDD connection 6112, which functions as the source of the switch transistor 55 through the via 4151. While the supply of the VVDD power supply potential to the standard cell 56 is cut off when the switch transistor 55 is off, the buffer 60 is supplied with the VDD power supply potential regardless of whether the switch transistor 55 is on or off.

In the first embodiment, the output of the buffer 60 is connected to the gate electrode 5120 that functions as a gate of the switch transistor 55 through a via 5111, the connection 5190, the via 5191, the control signal line 5170, and the via 5171. The power supply line 4150 corresponding to the VDD wiring, is electrically connected to the buffer 60 and the VDD connection 6112 that functions as the drain of the switch transistor 55.

The power supply line 2150, the via 2151, and the buffer 60 are arranged in the second power domain 31B in a plan view. Thus, according to the first embodiment, in a plan view, the buffer 60 that operates at the power supply potential of the VDD regardless of whether the switch transistor 55 is turned on or off can be arranged in the second power domain 31B to which the power supply potential of the VVDD is supplied. The buffer 60 and the switch transistor 55 are arranged close to each other in a plan view, and a power supply line for the VDD power supply potential is not to be laid in the second power domain 31B. As a result, the wiring between the buffer 60 and the switch transistor 55 can be made shorter, enabling a circuit area to be reduced. Thus, according to the first embodiment, the power supply potential can be efficiently supplied to the buffer 60.

The connection 5190 and the power supply line 2150 may be arranged in line in the X direction between the power supply line strip 2110A and the power supply line strip 2110B, which correspond to the VVDD wiring.

In FIGS. 9 to 11, the buffer 60 is connected to only one gate electrode 5120 of a plurality of the gate electrodes 5120. However, a plurality of the buffers 60 may be provided and the buffers 60 may be connected to each one of the gate electrodes 5120. The plurality of gate electrodes 5120 may be connected to each other through the wiring that is located lower than the semiconductor layer 6110, for example.

First Variation of First Embodiment

Figure 13:
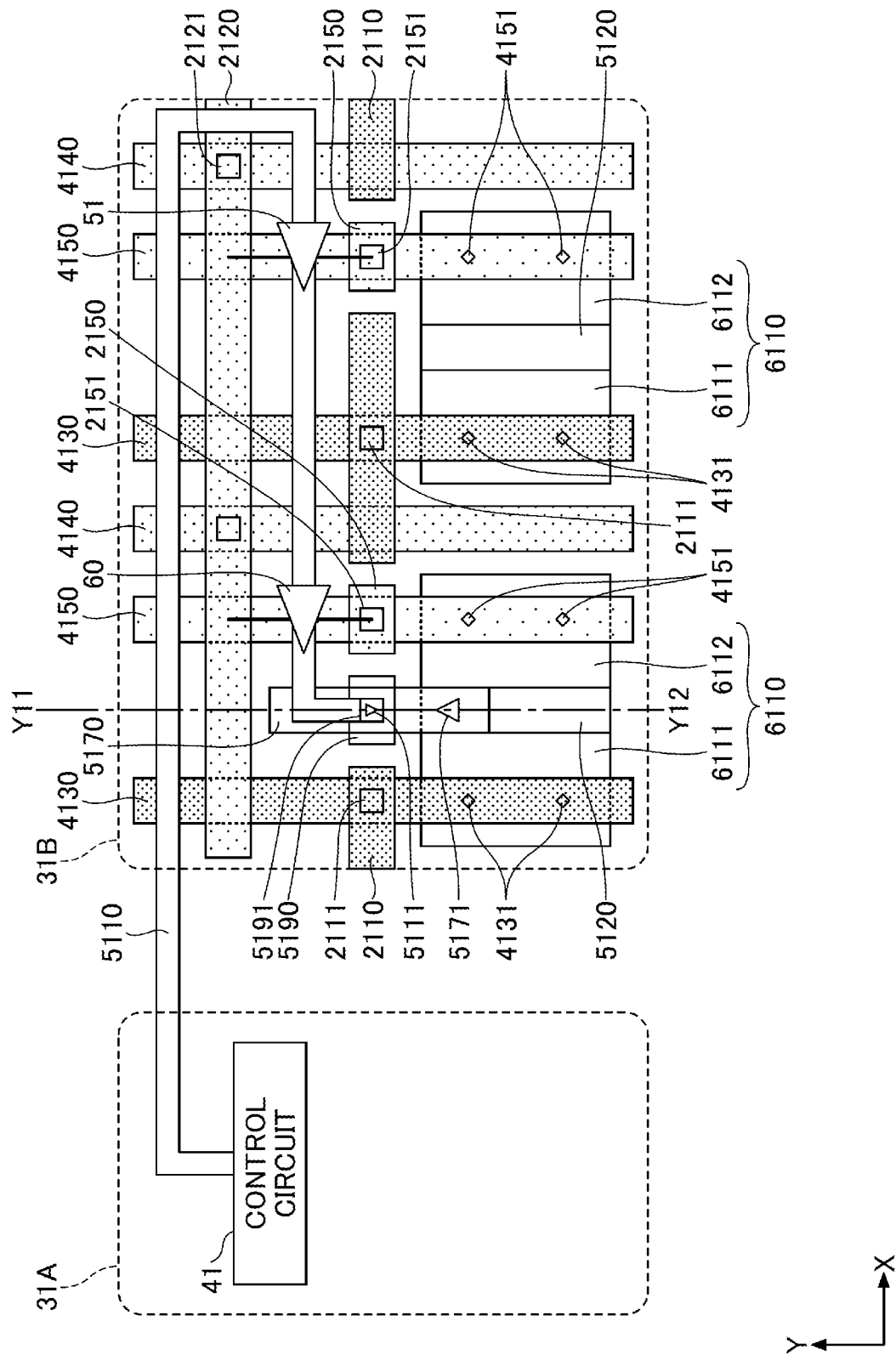
FIG. 13 is a schematic diagram showing a planar configuration of a semiconductor device according to a first variation of the first embodiment.
Figure 14:
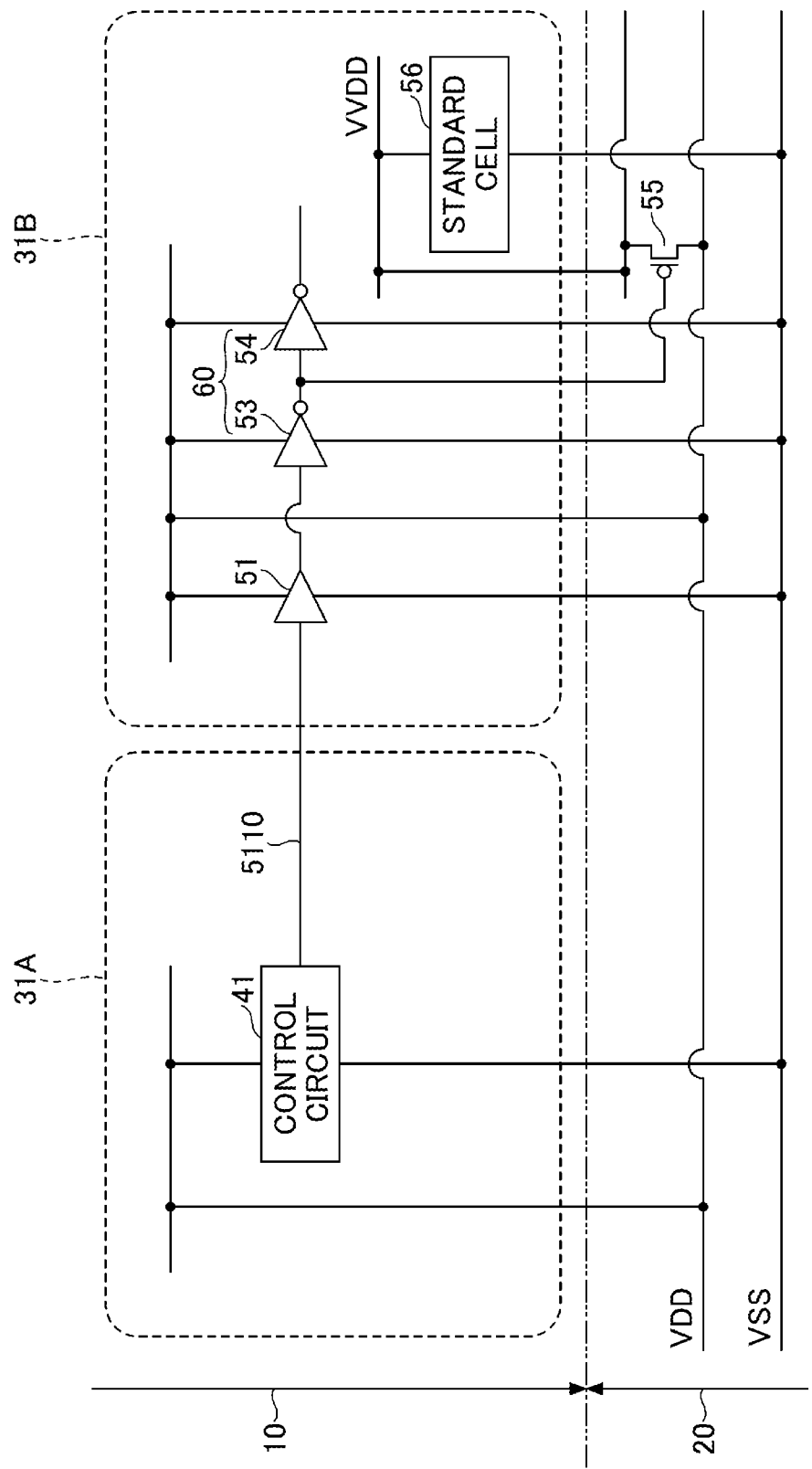
FIG. 14 is an equivalent circuit diagram of parts shown in FIG. 13.

Next, a first variation of the first embodiment will be described. The first variation differs from the first embodiment mainly in that it further includes a buffer 51. FIG. 13 is a schematic diagram showing a planar configuration of the semiconductor device according to a first variation of the first embodiment. FIG. 14 is an equivalent circuit diagram of parts shown in FIG. 13. FIGS. 13 and 14 mainly show the parts that differ from the first variation of the first embodiment, and the illustrations of other parts are omitted.

As shown in FIGS. 13 and 14, the buffer 51 is arranged in a stage preceding the buffer 60. That is, the buffer 51 is connected to the control signal line 5110 between the control circuit 41 and the buffer 60. The buffer 51 is supplied with the power supply potential of the VDD from the power supply line 2150 and the ground potential of the VSS from the power supply line 2120. The rest of the configuration is the same as in the first embodiment.

While the supply of the VVDD power supply potential to the standard cell 56 is cut off when the switch transistor 55 is off, the buffer 51 is supplied with the VDD power supply potential regardless of whether the switch transistor 55 is on or off, as with the buffer 60.

The rest of the configuration is the same as in the first embodiment.

The same effect as in the first embodiment can be obtained by the first variation. For example, in a plan view, in the second power domain 31B to which the power supply potential of the VVDD is supplied, the buffer 51 and the buffer 60, which operate at the power supply potential of the VDD regardless of whether the switch transistor 55 is turned on or off, can be arranged. Then, according to the first variation, the power supply potential can be efficiently supplied to the buffers 51 and 60.

Second Variation of First Embodiment

Figure 15:
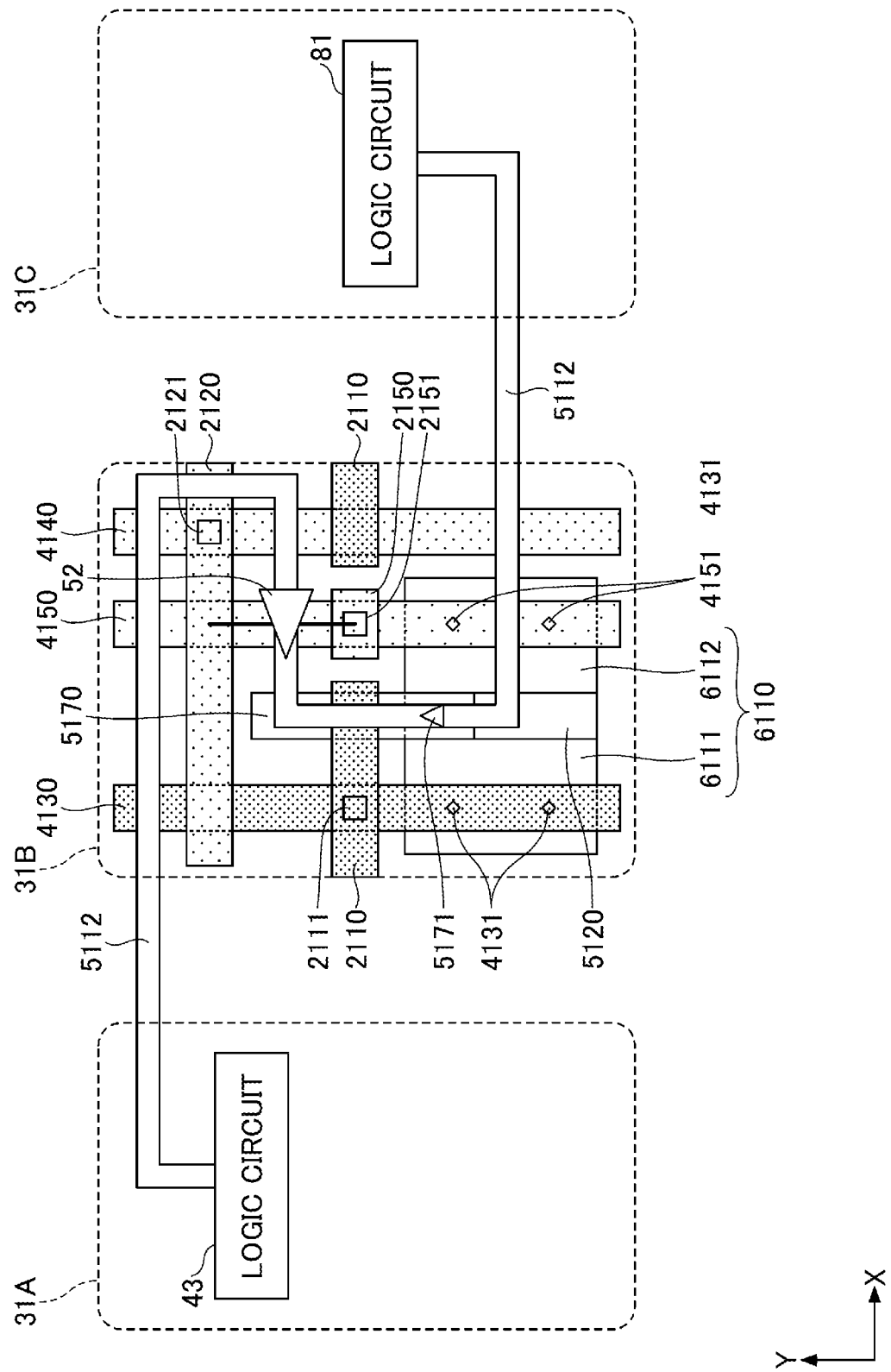
FIG. 15 is a schematic diagram showing a planar configuration of a semiconductor device according to a second variation of the first embodiment.
Figure 16:
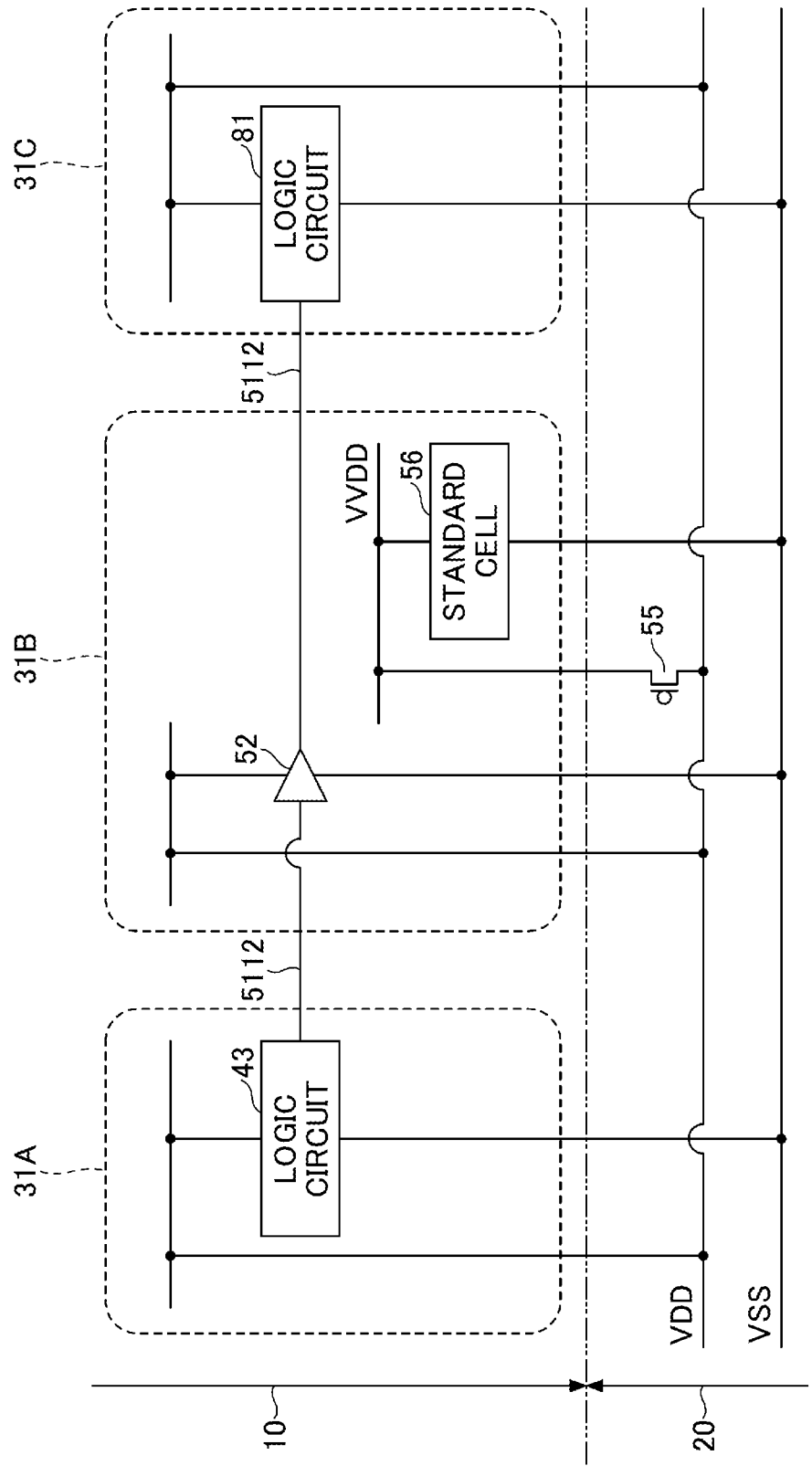
FIG. 16 is an equivalent circuit diagram of parts shown in FIG. 15.

Next, a second variation of the first embodiment will be described. The second variation differs from the first embodiment mainly in that it has characteristic parts in the switch transistor 55 and the buffer 52 in the circuit shown in FIG. 3. FIG. 15 is a schematic diagram showing the planar configuration of the semiconductor device according to the second variation of the first embodiment. FIG. 16 is an equivalent circuit diagram of the part shown in FIG. 15. FIGS. 15 and 16 mainly show the parts of the second variation that differ from the first embodiment, and illustrations of other parts are omitted.

As shown in FIGS. 15 and 16, the output signal from the logic circuit 43 provided in the first power domain 31A is input to the buffer 52 provided in the second power domain 31B. The output signal from the buffer 52 is input to the logic circuit 81 provided in the third power domain 31C through a signal line 5122.

The buffer 52 is connected between the power supply line 2150 and the power supply line 2120. The standard cell 56 that is arranged in the second power domain 31B is also connected to the power supply line 2120. The power supply line 2150 is connected to the power supply line 4150 through the via 2151 formed in the substrate 11. The power supply line 4150 is connected to the VDD connection 6112 which functions as the source of the switch transistor 55. While the supply of the VVDD power supply potential to the standard cell 56 is cut off when the switch transistor 55 is off, the buffer 52 is supplied with the VDD power supply potential regardless of whether the switch transistor 55 is on or off, as with the buffer 60.

The rest of the configuration is the same as in the first embodiment.

The same effect as in the first embodiment can be also obtained by the second variation. For example, in a plan view, in the second power domain 31B to which the power supply potential of the VVDD is supplied, the buffer 52 that operates at the power supply potential of the VDD regardless of whether the switch transistor 55 is turned on or off, can be arranged. According to the second variation, the power supply potential can be efficiently supplied to the buffers 52.

The buffer 52 can contribute to suppressing the dulling of signals transmitted from the logic circuit 43 to the logic circuit 81, for example, when a transmission path from the logic circuit 43 to the logic circuit 81 is long. The buffer 52 operates even when the switch transistor 55 is off, and can transmit the signal output from the logic circuit 43 to the logic circuit 81.

Second Embodiment

Figure 17:
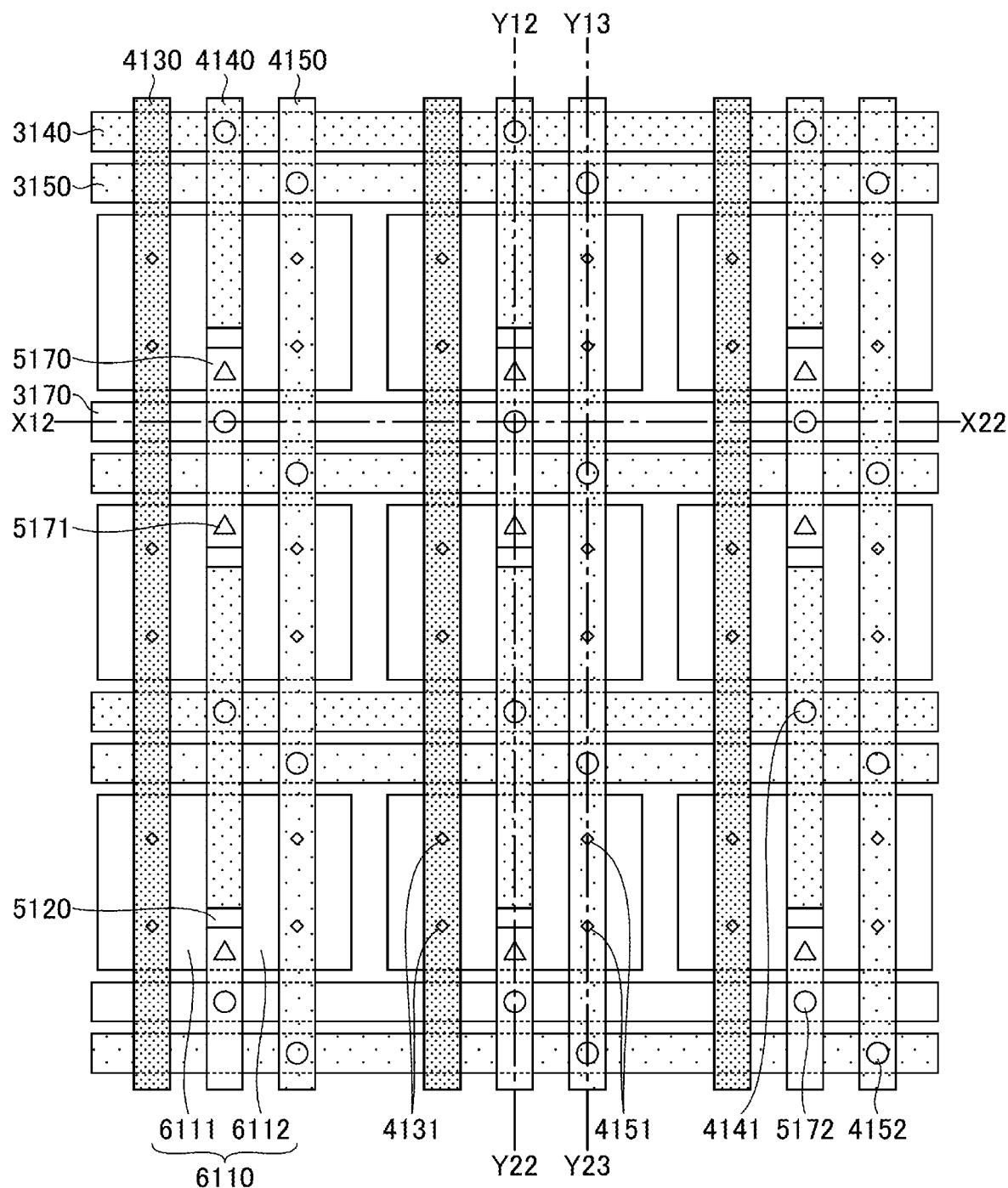
FIG. 17 is a schematic diagram (1) showing a planar configuration of a semiconductor device according to a second embodiment.
Figure 18:
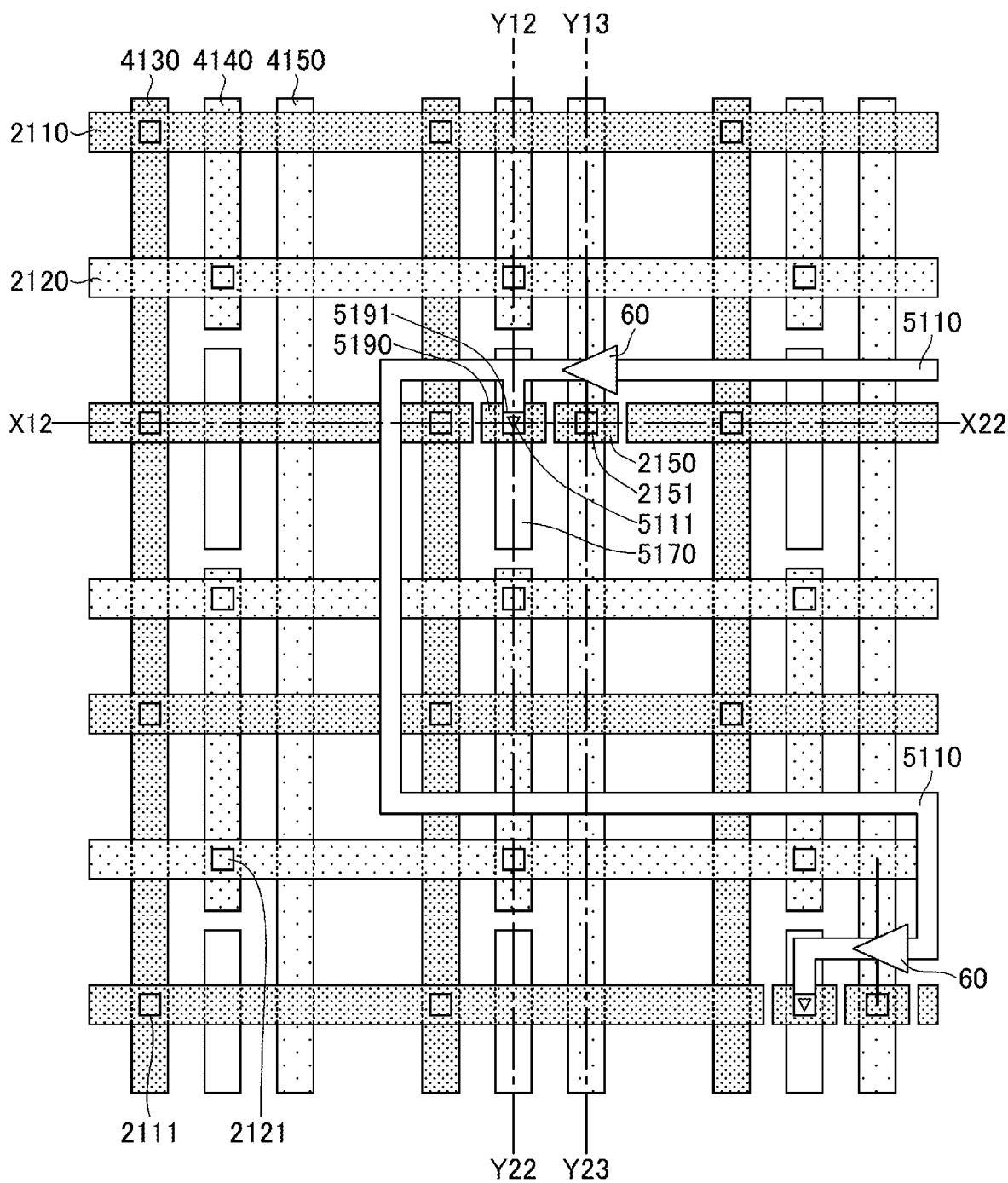
FIG. 18 is a schematic diagram (2) showing a planar configuration of a semiconductor device according to the second embodiment.
Figure 19:
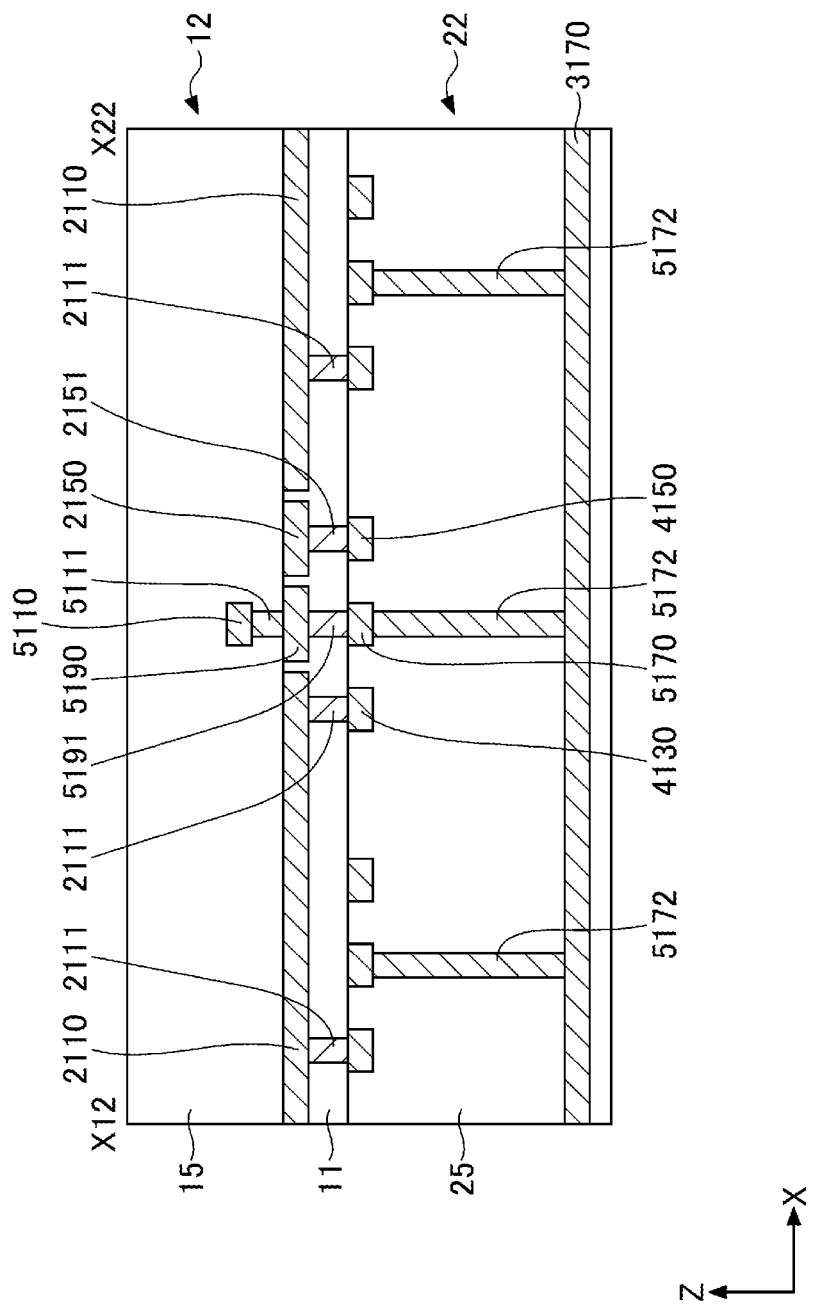
FIG. 19 is a cross-sectional view (1) of a semiconductor device according to the second embodiment.
Figure 20:
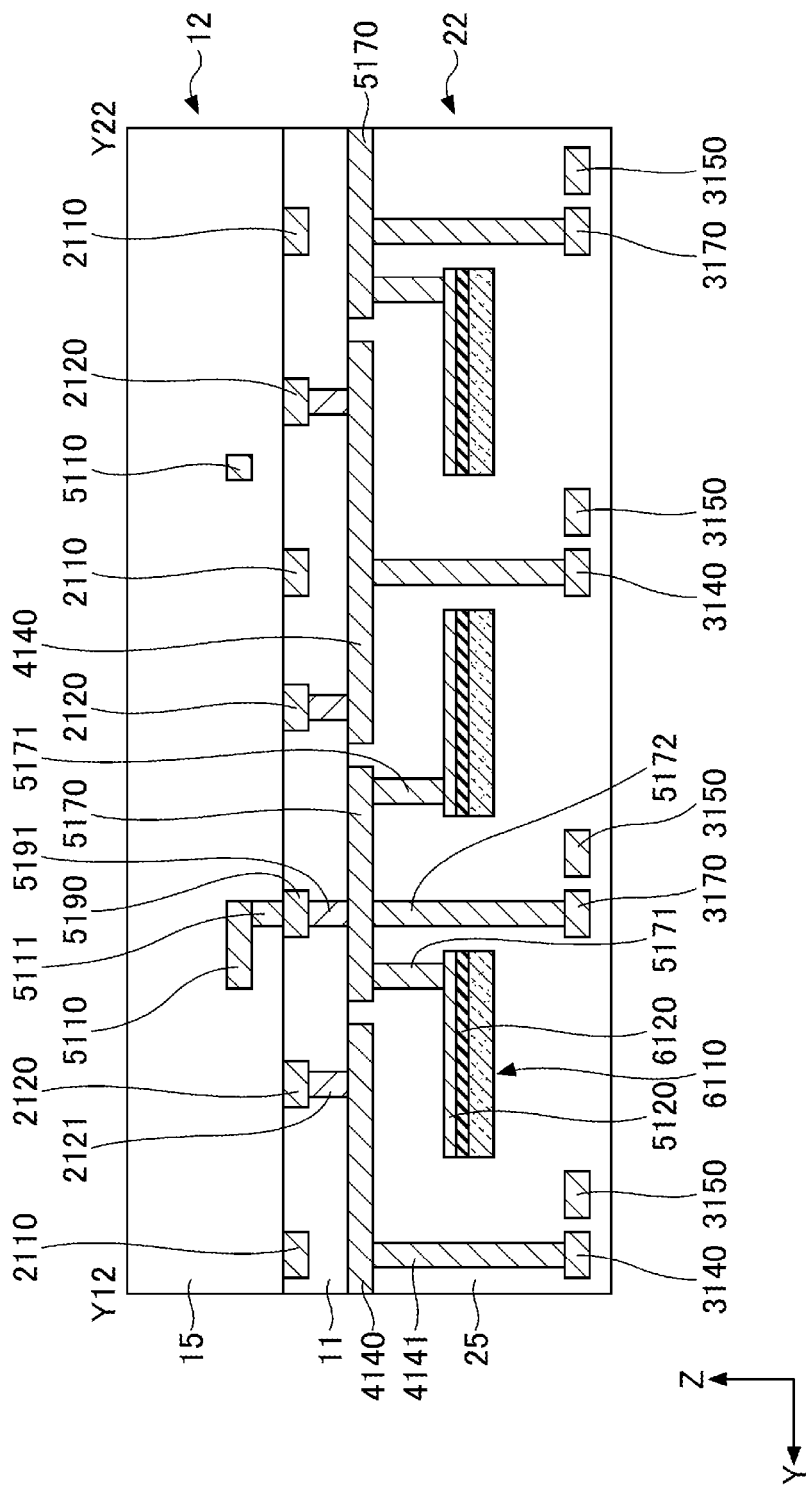
FIG. 20 is a cross-sectional view (2) of a semiconductor device according to the second embodiment.
Figure 21:
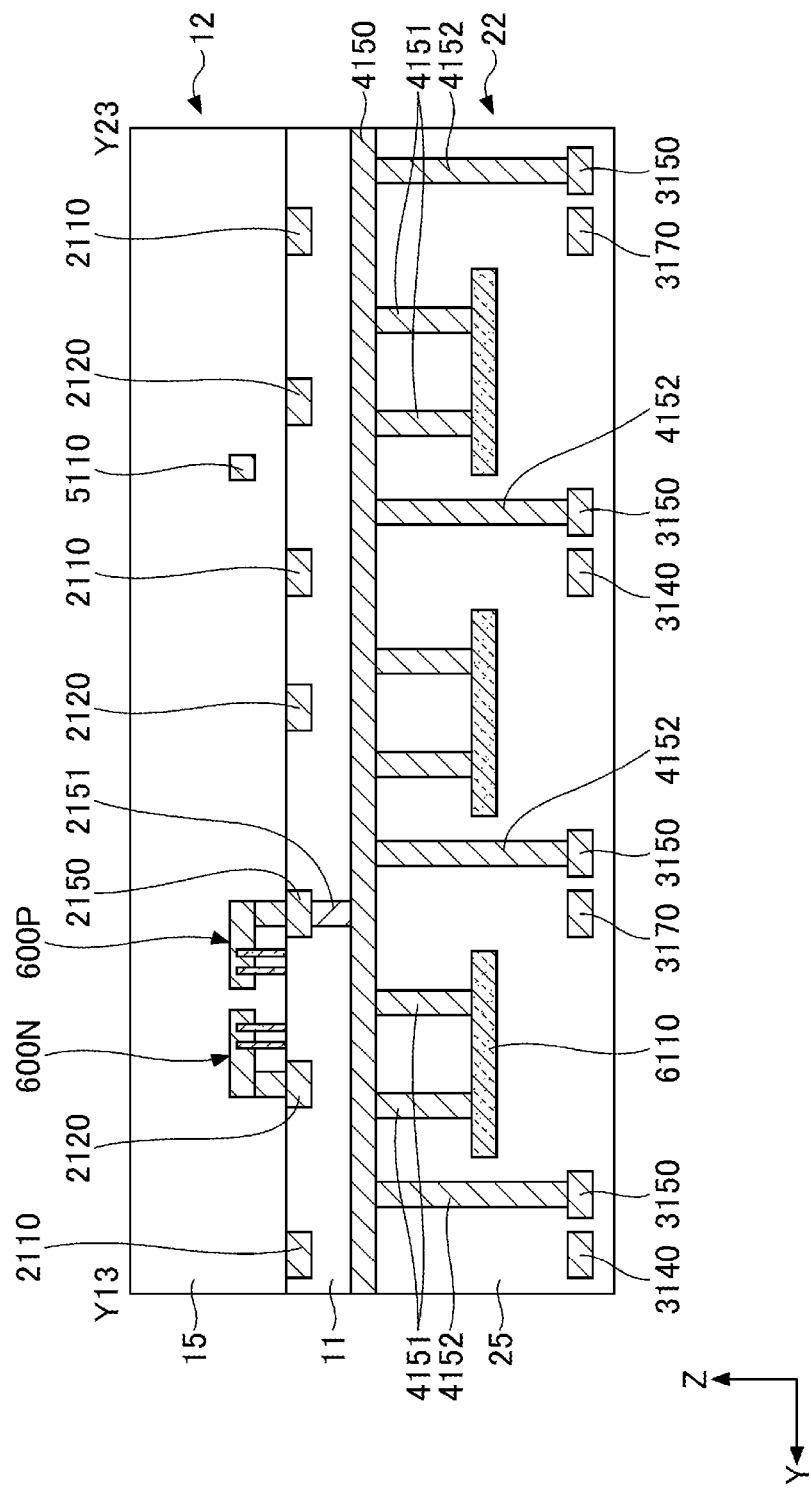
FIG. 21 is a cross-sectional view (3) of a semiconductor device according to the second embodiment.

Next, a second embodiment will be described. The second embodiment differs from the first embodiment mainly in the number of switch transistors 55 arranged in the second power domain 31B. FIGS. 17 and 18 are schematic diagrams showing planar configurations of the semiconductor device according to the second embodiment. FIGS. 19 to 21 are cross-sectional views of the semiconductor device according to the second embodiment. FIG. 17 mainly shows the planar configuration of the second chip 20, and FIG. 18 mainly shows the planar configuration of the first chip 10. FIG. 19 is a cross-sectional view along the line X12-X22 in FIGS. 17 and 18. FIG. 20 is a cross-sectional view along the line Y12-Y22 in FIGS. 17 and 18. FIG. 21 is a cross-sectional view along the line Y13-Y23 in FIGS. 17 and 18. FIGS. 17 to 21 mainly show parts of the second embodiment that differ from the first embodiment, and the illustrations of other parts are omitted.

In the second embodiment, a plurality of the semiconductor layers 6110 are arranged in a grid pattern. A plurality of the power supply lines 4130, 4140, 4150, a control signal line 5170, a plurality of the gate insulating films 6120 (see FIG. 11), the plurality of gate electrodes 5120, and the like are arranged so as to correspond to the plurality of semiconductor layers 6110. In this way, a plurality of the switch transistors 55 are arranged in a grid pattern.

In the insulating layer 25, power supply lines 3140, power supply lines 3150, and control signal lines 3170 extending in the X direction are provided. The power supply lines 3140 and 3150 and the control signal lines 3170 are provided below the semiconductor layer 6110. The power supply lines 3140 correspond to the VSS wiring, and the power supply lines 3150 correspond to the VDD wiring. The power supply lines 3150 are provided in all the areas between the plurality of semiconductor layers 6110 that are adjacent to each other in the Y direction. The power supply lines 3140 and the power supply lines 3150 may overlap a part of the semiconductor layer 3110 in a plan view. The power supply lines 3140 and the control signal lines 3170 are alternately provided in a plurality of gaps between the semiconductor layers 6110 that are adjacent to each other in the Y direction in a plan view. In the insulating layer 25, vias 4141 that electrically connect the power supply lines 3140 to the power supply lines 4140, vias 4152 that electrically connect the power supply lines 3150 to the power supply lines 4150, and the vias 5172 that electrically connect the control signal lines 3170 to the control signal lines 5170 are formed. The vias 4141 are formed under the power supply lines 4140, the vias 4152 are formed under the power supply lines 4150, and the vias 5172 are formed under the control signal lines 5170. The power supply lines 3140 and 4140 have a mesh structure in a plan view. The power supply lines 3150 and 4150 have a mesh structure in a plan view.

The gate electrodes 5120 of the plurality of switch transistors 55 lined up in the X direction are commonly connected to the control signal lines 3170 extending in the X direction. Therefore, the plurality of switch transistors 55 lined up in the X direction may be each provided with one buffer 60, for example. Further, the gate electrodes 5120 of the two switch transistors 55 adjacent in the Y direction are commonly connected to the control signal lines 5170 extending in the Y direction. Therefore, for example, two switch transistors 55 adjacent in the Y direction may be provided with one buffer 60, for example. In this way, the plurality of switch transistors 55 may be driven through a single buffer 60.

The rest of the configuration is the same as in the first embodiment.

In FIG. 21, the P-channel transistor 600P and the N-channel transistor 600N included in the buffer 60 are shown in a simplified manner. The P-channel transistor 600P and the N-channel transistor 600N are, for example, FinFETs.

The same effects as in the first embodiment can be obtained by the second embodiment. For example, the power supply potential can be efficiently supplied to the plurality of buffers 60.

First Variation of Second Embodiment

Figure 22:
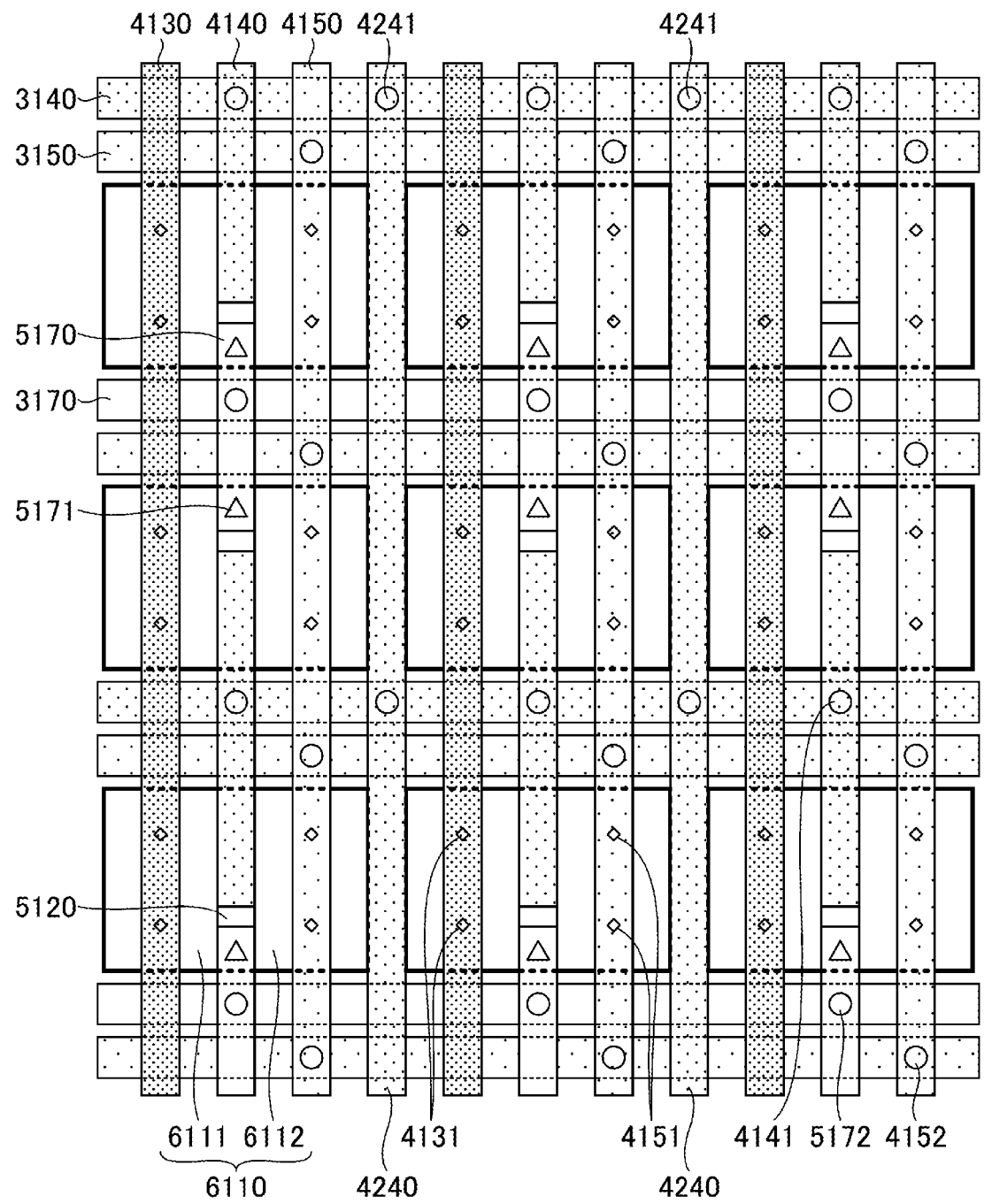
FIG. 22 is a schematic diagram showing a planar configuration of the semiconductor device according to a first variation of the second embodiment.

Next, a first variation of the second embodiment will be described. The first variation differs from the second embodiment mainly in that it further includes power supply lines that correspond to the VSS wiring and extend in the Y direction. FIG. 22 is a schematic diagram showing a planar configuration of the semiconductor device according to the first variation of the second embodiment. FIG. 22 mainly shows the planar configuration of the second chip 20. FIG. 22 mainly shows parts of the first variation that differ from the second embodiment, and the illustrations of other parts are omitted.

As shown in FIG. 22, in a plan view, the power supply lines 4240 corresponding to the VSS wiring, are provided between the adjacent semiconductor layers 6110 in the X direction. The power supply lines 4240 are formed in the surface layer of the insulating layer 25. In the first variation, the power supply lines 3140, 4140 and 4240 have a mesh structure in a plan view.

The rest of the configuration is the same as in the first embodiment.

The same effect as in the second embodiment can be obtained by the first variation. In addition, the power supply potential of the VSS can be further enhanced.

Third Embodiment

Figure 23:
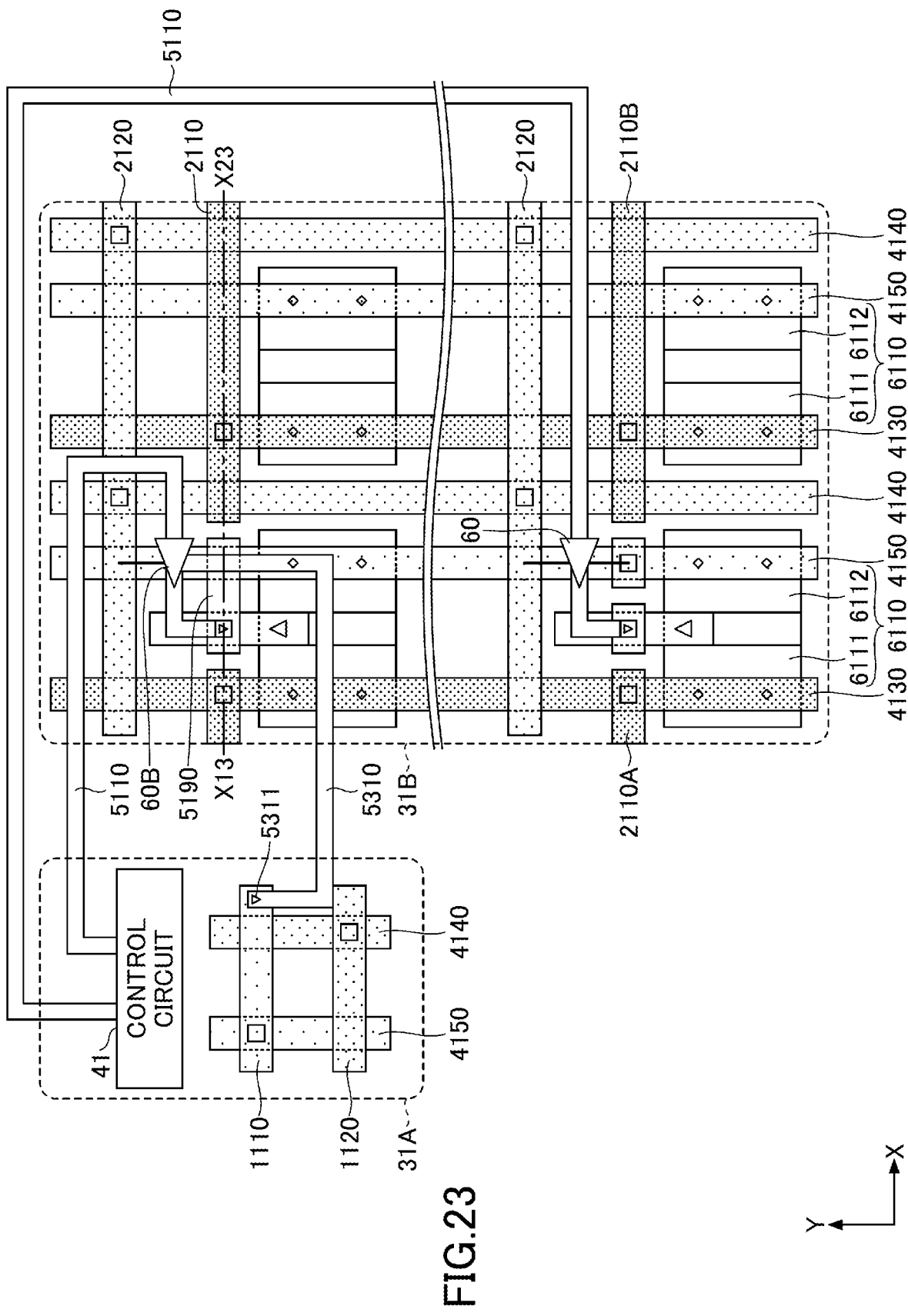
FIG. 23 is a schematic diagram showing a planar configuration of the semiconductor device according to a third embodiment.
Figure 24:
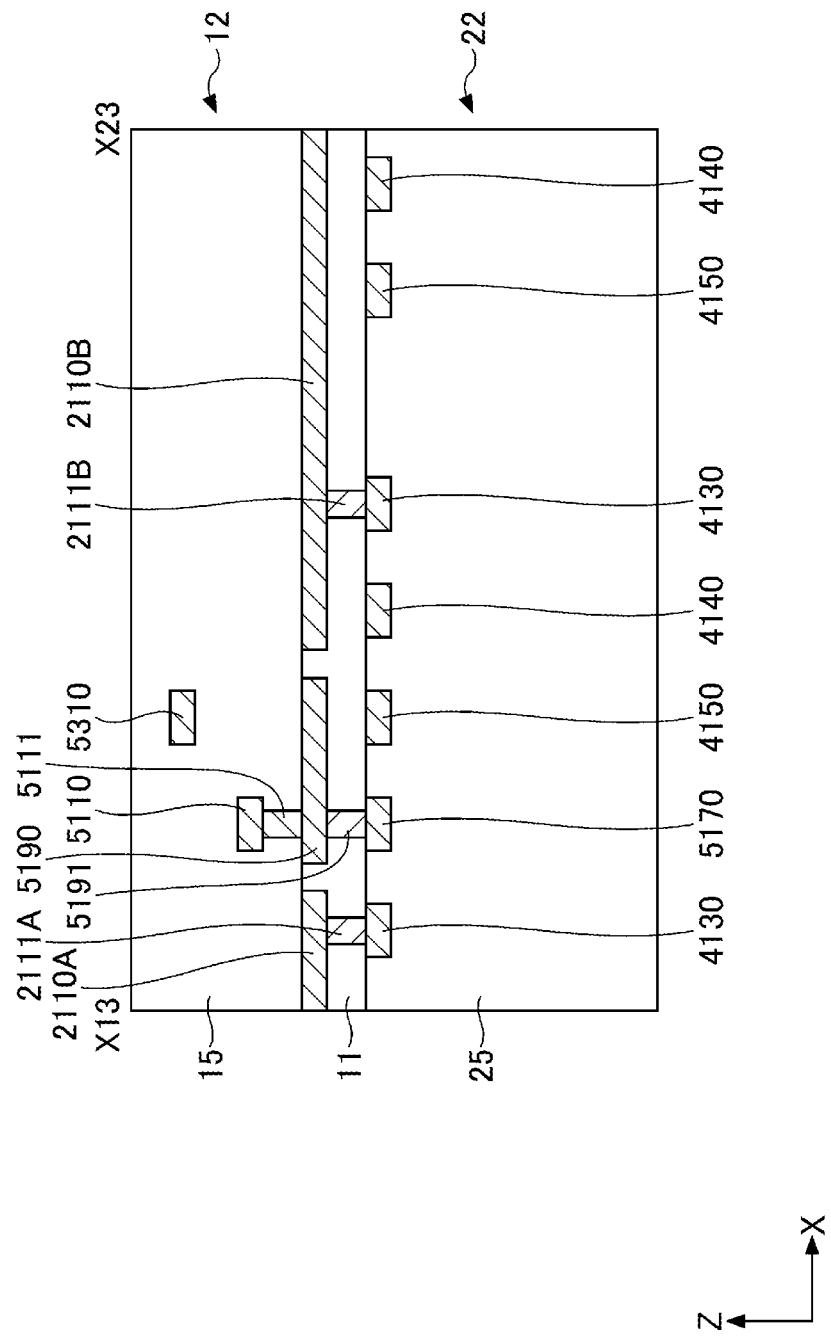
FIG. 24 is a cross-sectional view showing the semiconductor device according to a third embodiment.
Figure 25:
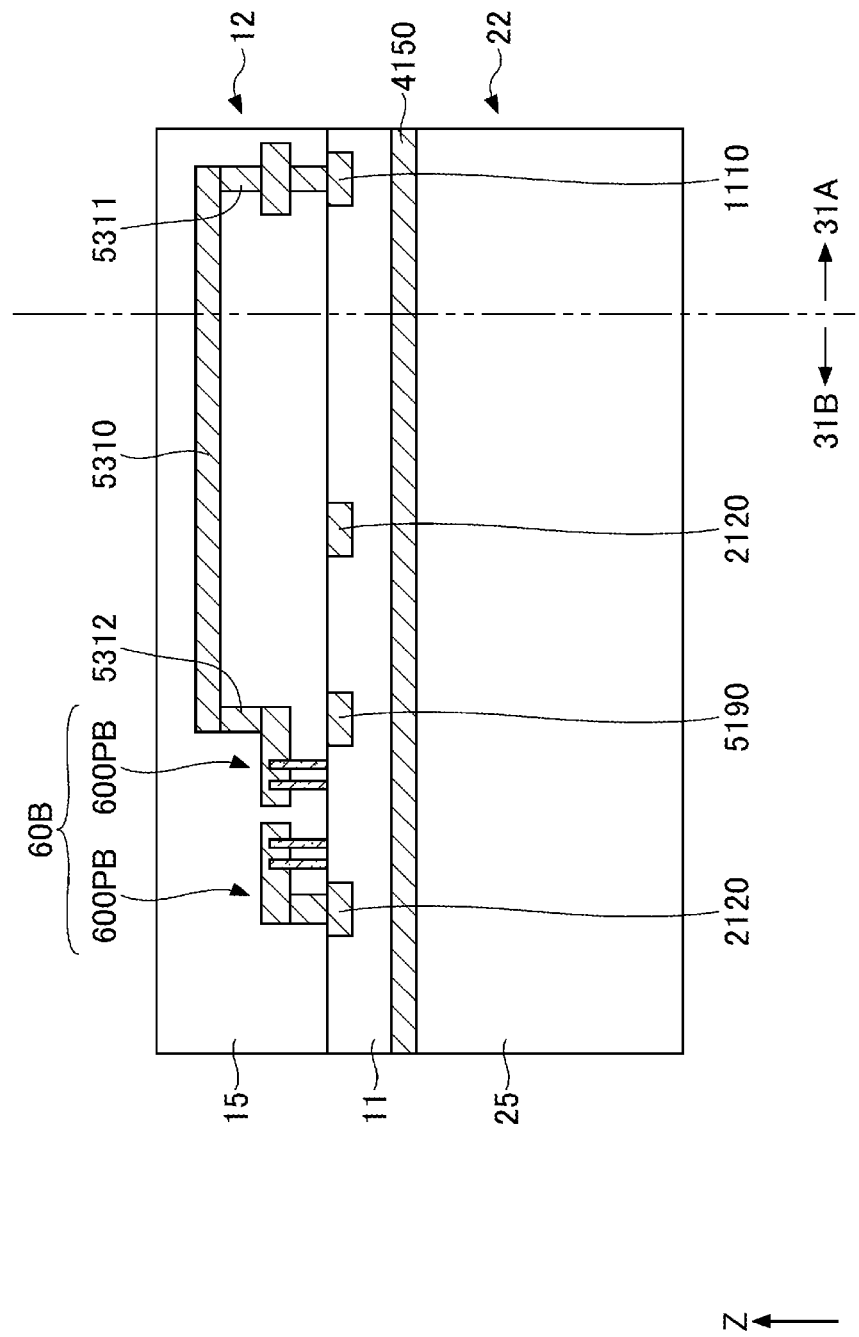
FIG. 25 is a cross-sectional view showing a connection relationship in the semiconductor device according to a third embodiment.

Next, a third embodiment will be described. The third embodiment differs from the first embodiment, etc. mainly in that it includes a buffer with a different supply path for the VDD power supply potential. FIG. 23 is a schematic diagram showing a planar configuration of the semiconductor device according to the third embodiment. FIG. 24 is a cross-sectional view showing the semiconductor device according to the third embodiment. FIG. 25 is a cross-sectional view showing a connection relationship in the semiconductor device according to the third embodiment. FIG. 24 is a cross-sectional view along a line X13-X23 in FIG. 23. FIGS. 23 to 25 mainly show the parts of the third embodiment that differ from the first embodiment, and the illustration of other parts are omitted.

In the third embodiment, as shown in FIGS. 23 to 25, in addition to the buffer 60, a buffer 60B is provided. The buffer 60B is connected to the gate electrode 5120 of the switch transistor 55, which is different from the switch transistor 55 driven by the buffer 60. While the VDD power supply potential is supplied to the buffer 60 from the power supply line 2150, the VDD power supply potential is supplied to the buffer 60B from a power supply line 5310 provided in the insulating layer 15. In FIG. 25 a cross-sectional view along the power supply line 5310 is schematically shown. The power supply line 5310 is connected to the power supply line 1110 through a via 5311 provided in the insulating layer 15 in the first power domain 31A, for example. In some of the switch transistors 55 in FIG. 23, the illustrations of the via 5171 and the control signal line 5170 are omitted. That is, the via 5171 and the control signal line 5170 are arranged in each of the plurality of switch transistors 55. The switch transistors 55 may be each driven by either the buffer 60 or the buffer 60B.

The rest of the configuration is the same as in the first embodiment.

The same effect as in the first embodiment can be obtained by the third embodiment. With respect to the supply of the VDD power supply potential to the buffer 60B, the power supply line 2150 may not be provided.

First Variation of Third Embodiment

Figure 26:
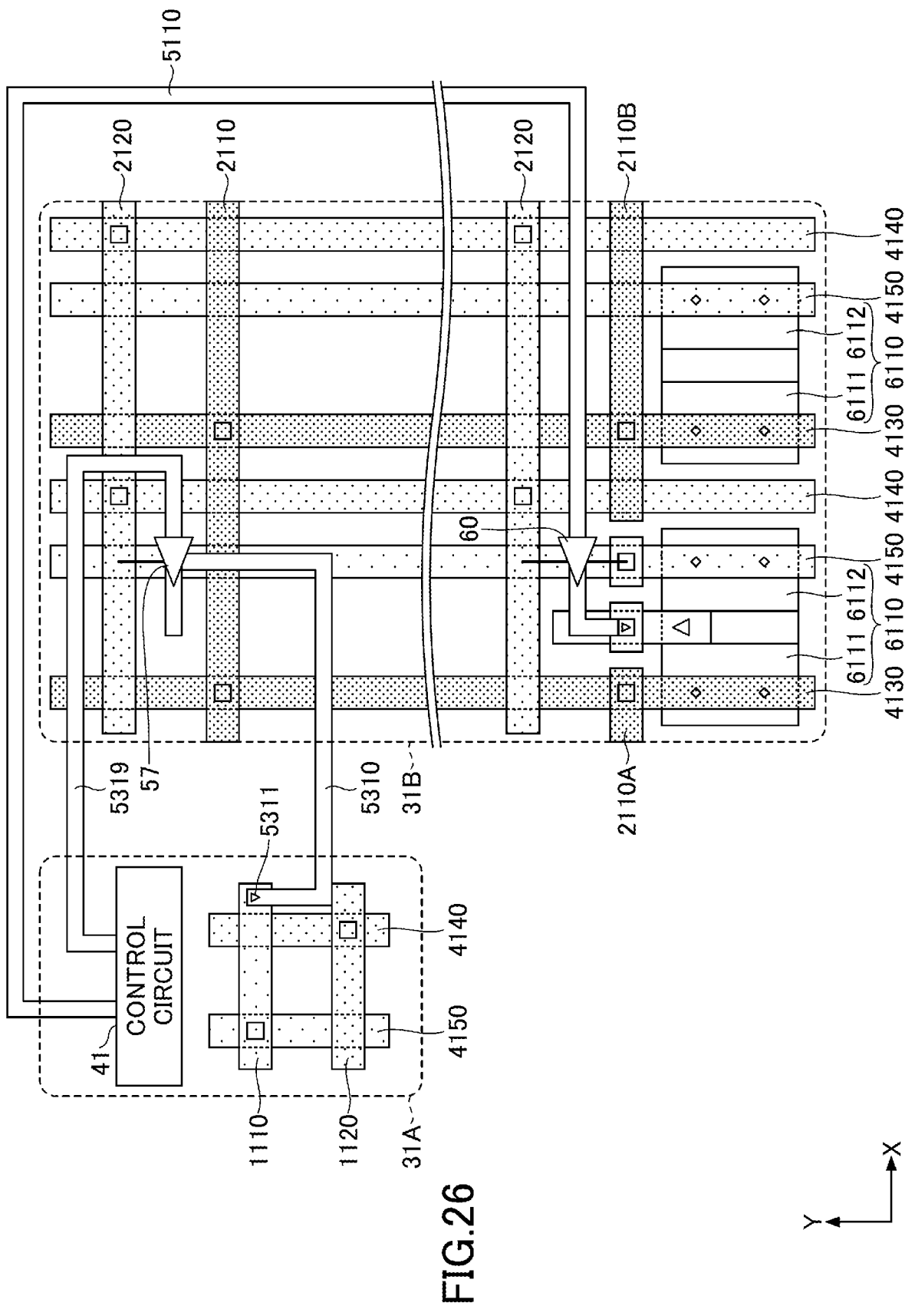
FIG. 26 is a schematic diagram showing a planar configuration of the semiconductor device according to a first variation of the third embodiment.

Next, a first variation of the third embodiment will be described. The first variation differs from the third embodiment mainly in terms of the output destination of the buffer, which has a different supply path of the VDD power supply potential from the buffer 60. FIG. 26 is a schematic diagram showing a planar configuration of the semiconductor device according to the first variation of the third embodiment. FIG. 26 mainly shows the parts of the first variation that differ from the third embodiment and the illustrations of other parts are omitted.

In the first variation, a buffer 57 is provided instead of the buffer 60B. Like the buffer 60B, the buffer 57 is supplied with the power supply potential of the VDD from the power supply line 5310 provided in the insulating layer 15. A control signal is input to the buffer 57 from the control circuit 41 through a control signal line 5319, which is independent of the control signal line 5110. The output of the buffer 57 is input to a circuit that is different from the switch transistor 55. In some of the switch transistors 55 shown in FIG. 26, the illustration of the via 5171 and the control signal line 5170 is omitted. That is, the via 5171 and the control signal line 5170 are arranged in each of the plurality of switch transistors 55.

The rest of the configuration is the same as in the third embodiment.

The same effect as in the third embodiment can be obtained by the first variation. With respect to the output destination of the buffer 57, the connection 5190 may not be provided. Therefore, the power supply line 2110 may not be divided into a plurality of parts.

Fourth Embodiment

Figure 27:
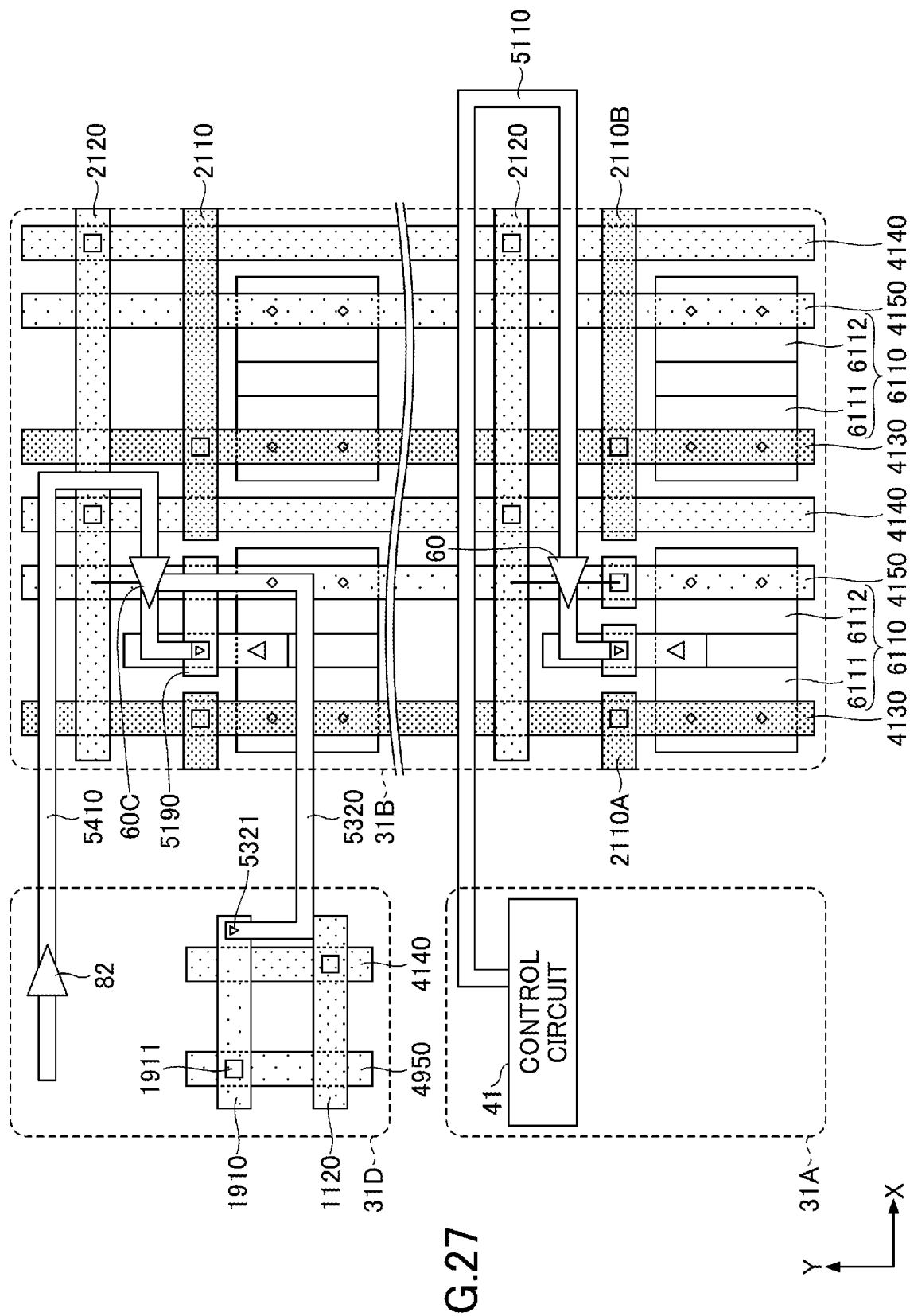
FIG. 27 is a schematic diagram showing a planar configuration of the semiconductor device according to a fourth embodiment.
Figure 28:
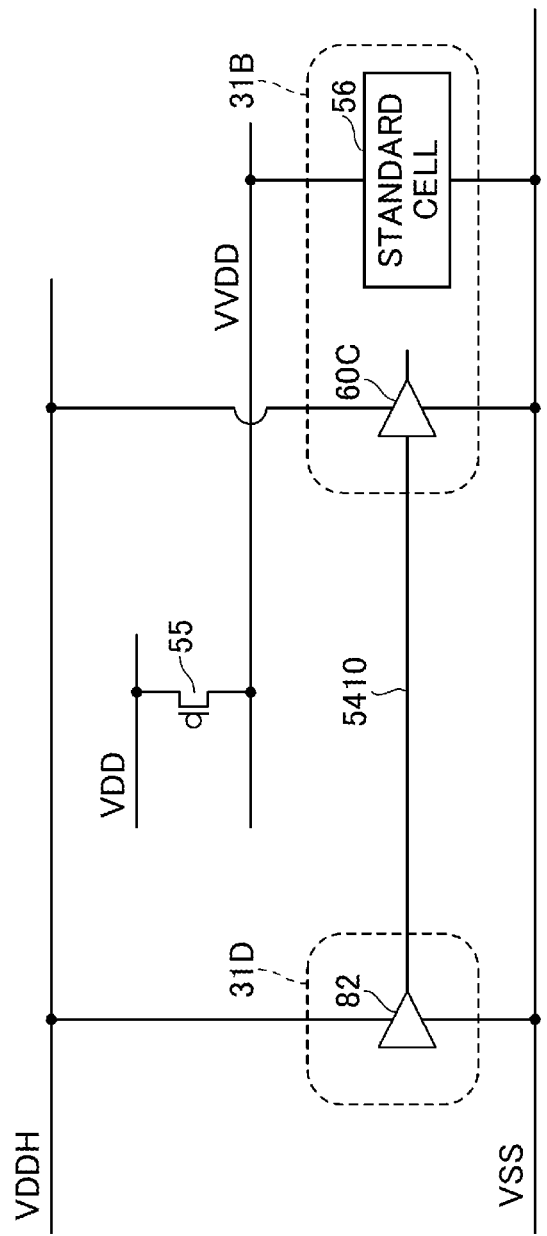
FIG. 28 is an equivalent circuit diagram of parts shown in FIG. 27.

Next, a fourth embodiment will be described. The fourth embodiment differs from the first embodiment etc. mainly in that it includes a buffer to which a power supply potential that is different from the VDD is supplied. FIG. 27 is a schematic diagram showing a planar configuration of the semiconductor device according to the fourth embodiment. FIG. 28 is an equivalent circuit diagram of some of parts shown in FIG. 27. FIGS. 27 and 28 mainly show the parts of the fourth embodiment that differ from the first embodiment, and the illustrations of other parts are omitted.

The semiconductor device according to the fourth embodiment has a fourth power domain 31D. In the fourth power domain 31D, the power supply line 1120, a power supply line 1910, and a buffer 82 are provided. The power supply line 1120 corresponds to the VSS wiring, and the power supply line 1910 corresponds to the VDDH wiring which has a power supply potential different from the VDD wiring. The power supply line 1910 extends in the X direction as with the power supply line 1120. The ground potential of the VSS and the power supply potential of the VDDH are supplied to the buffer 82.

On the surface layer of the insulating layer 25 of the second chip 20, a power supply line 4950 is formed. The power supply line 4950 extends in the Y direction. The power supply line 4950 corresponds to the VDDH wiring. The power supply line 4950 is connected to the power supply line 1910 through a via 1911 formed in the substrate 11.

In the fourth embodiment, in addition to the buffer 60, a buffer 60C is provided. The buffer 60C is connected to the gate electrode 5120 of the switch transistor 55 that is different from the switch transistor 55 driven by the buffer 60. The buffer 60 is supplied with the power supply potential of the VDD from the power supply line 2150. The buffer 60C is supplied with the power supply voltage of the VDDH which is different from the VDD, from a power supply line 5320 provided in the insulating layer 15. For example, the power supply line 5320 is connected to the power supply line 1910 through a via 5321 provided in the insulating layer 15 in the fourth power domain 31D. The output signal of the buffer 82 is input to the buffer 60C via a control signal line 5410. A control circuit that controls on/off of the switch transistor 55 is connected to a stage preceding the buffer 82 through the buffer 60C. In some of the switch transistors 55 shown in FIG. 27, the illustration of the via 5171 and the control signal line 5170 is omitted. That is, the via 5171 and the control signal line 5170 are arranged in each of the plurality of switch transistors 55. The switch transistors 55 may be each driven by either the buffer 60 or the buffer 60B.

The rest of the configuration is the same as in the first embodiment.

The same effect as in the first embodiment can be obtained by the fourth embodiment.

In other embodiments, a plurality of types of power supply potentials may be used.

Figure 29:
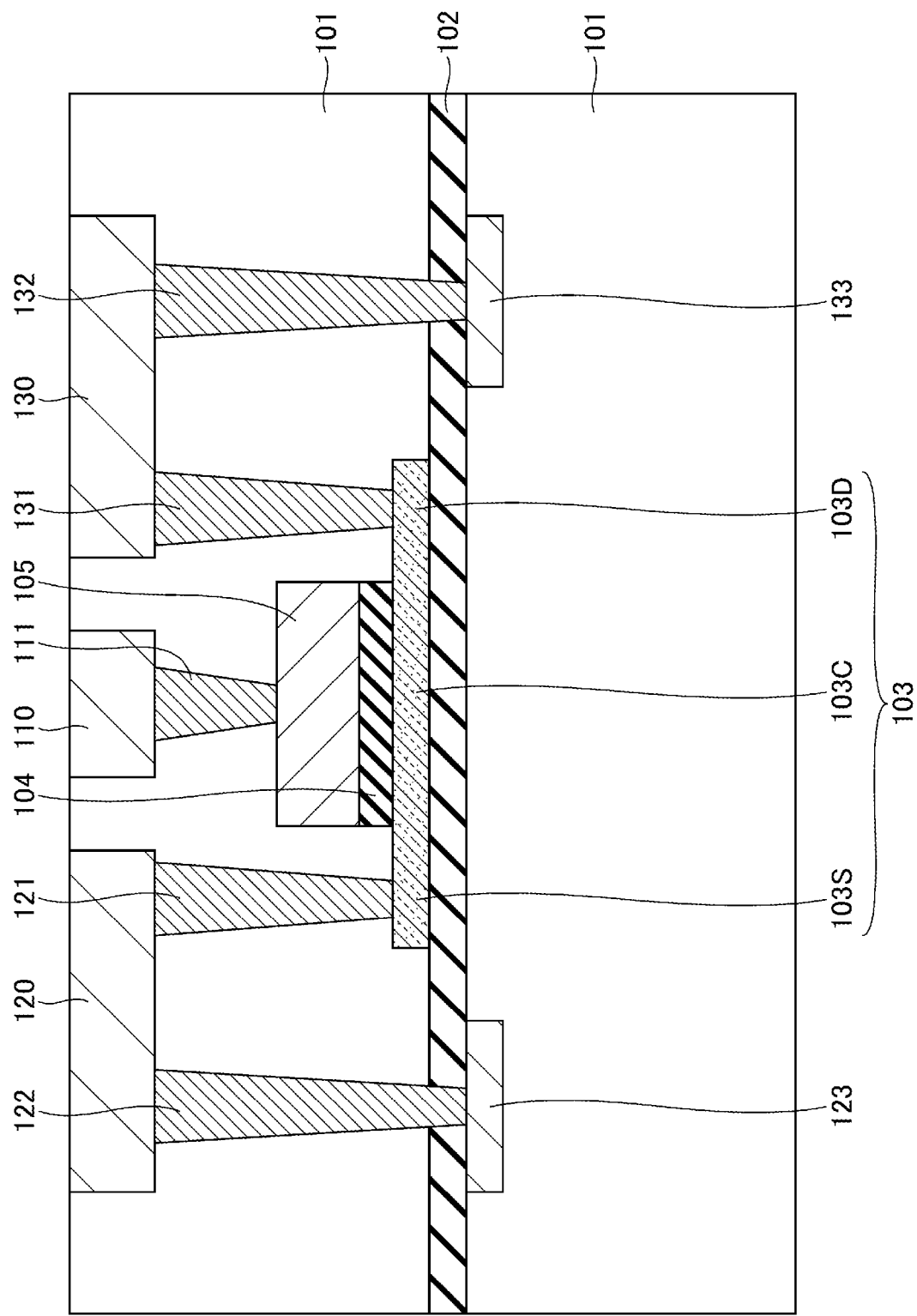
FIG. 29 is a cross-sectional view (1) showing an example of a cross-sectional configuration of a switch transistor.
Figure 30:
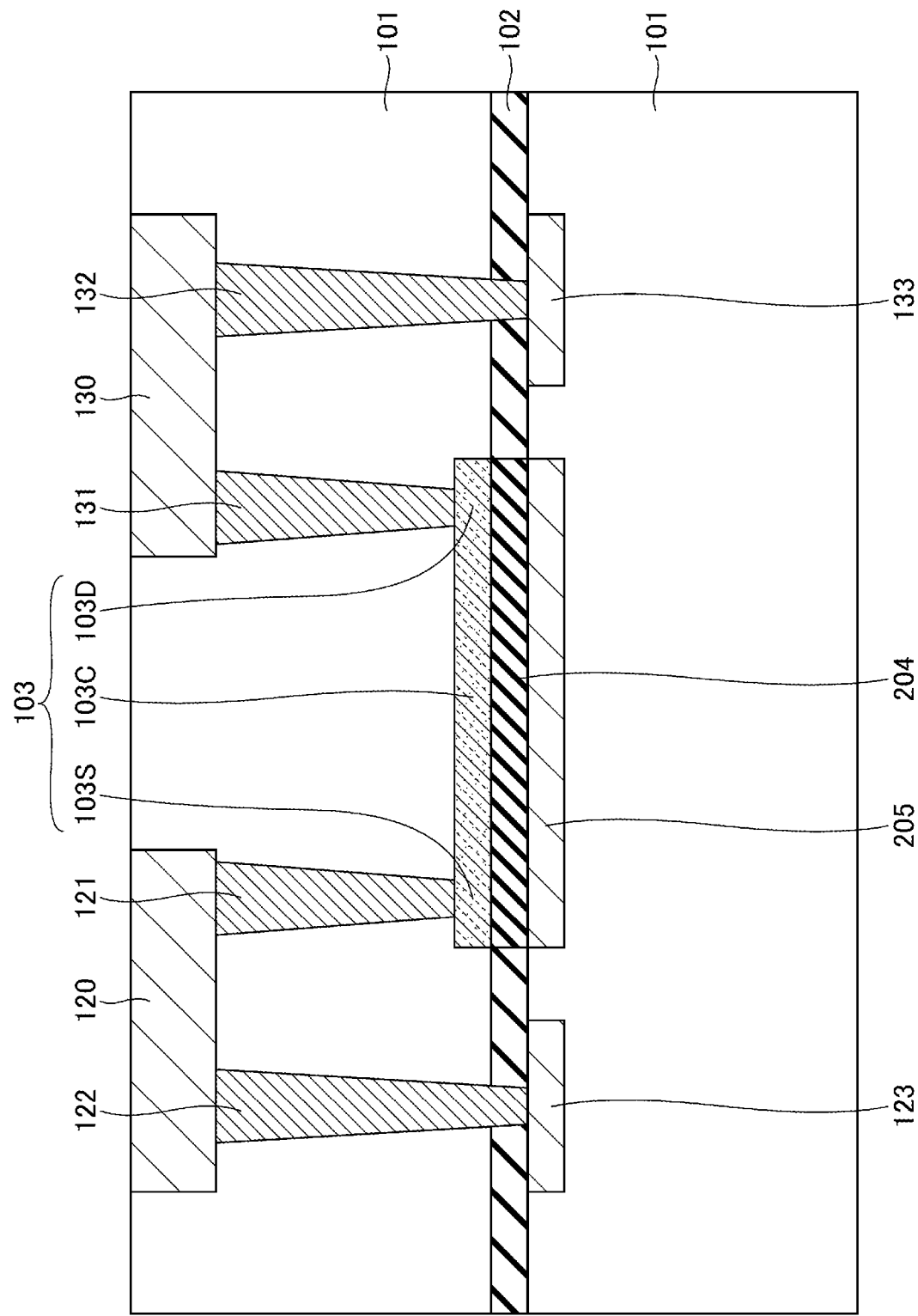
FIG. 30 is a cross-sectional view (2) showing an example of a cross-sectional configuration of a switch transistor.

An overview of the cross-sectional configuration of the switch transistor will be described. FIGS. 29 and 30 are cross-sectional views illustrating an example of the cross-sectional configuration of the switch transistor.

In a first example shown in FIG. 29, a base insulating film 102 is provided in an insulating layer 101, and a semiconductor layer 103, a gate insulating film 104, and a gate electrode 105 are provided on the base insulating layer 102. On a surface layer of the insulating layer 101, a control signal line 110, a power supply line 120 corresponding to the VDD wiring, and a power supply line 130 corresponding to the VVDD wiring are provided. The semiconductor layer 103 has a channel 103C, a source 103S and a drain 103D, between which the channel 103C is interposed. The power supply line 120 and the source 103S are connected through a via 121, and the power supply line 130 and the drain 103D are connected through a via 131. Under the base insulating film 102, a power supply line 123 corresponding to the VDD wiring, and a power supply line 133 corresponding to the VVDD wiring, are provided. The power supply line 120 and the power supply line 123 are connected through a via 122, and the power supply line 130 and the power supply line 133 are connected through a via 132. The control signal line 110 is connected to the gate electrode 105 through a via 111.

In the second example shown in FIG. 30, the base insulating film 102 is provided with a gate insulating film 204, the semiconductor layer 103 is provided on the gate insulating film 204, and a gate electrode 205 is provided under the gate insulating film 204. The other configurations are the same as in the first example.

Materials of the base insulating film are, for example, silicon oxide, silicon nitride, silicon carbide, silicon oxynitride, silicon oxycarbide, and the like. The materials of the semiconductor layer are, for example, InGaZnO (IGZO), ZnO, ZnSnO, InZnO, and the like. Materials of the gate insulating film are, for example, $SiO_2$, $SiO_xN_y$, SiN, $Al_2O_3$, and the like. Materials of the gate electrode are metals such as molybdenum, titanium, chromium, tantalum, magnesium, silver, tungsten, aluminum, copper, neodymium, ruthenium, scandium, and the like. The material of the gate electrode may be graphene and the like.

The switch transistor 55 described in each embodiment and each variation corresponds to the first example, but the structure of the second example may be adopted as the structure of the switch transistor 55 in each embodiment and each variation.

Fifth Embodiment

Figure 31:
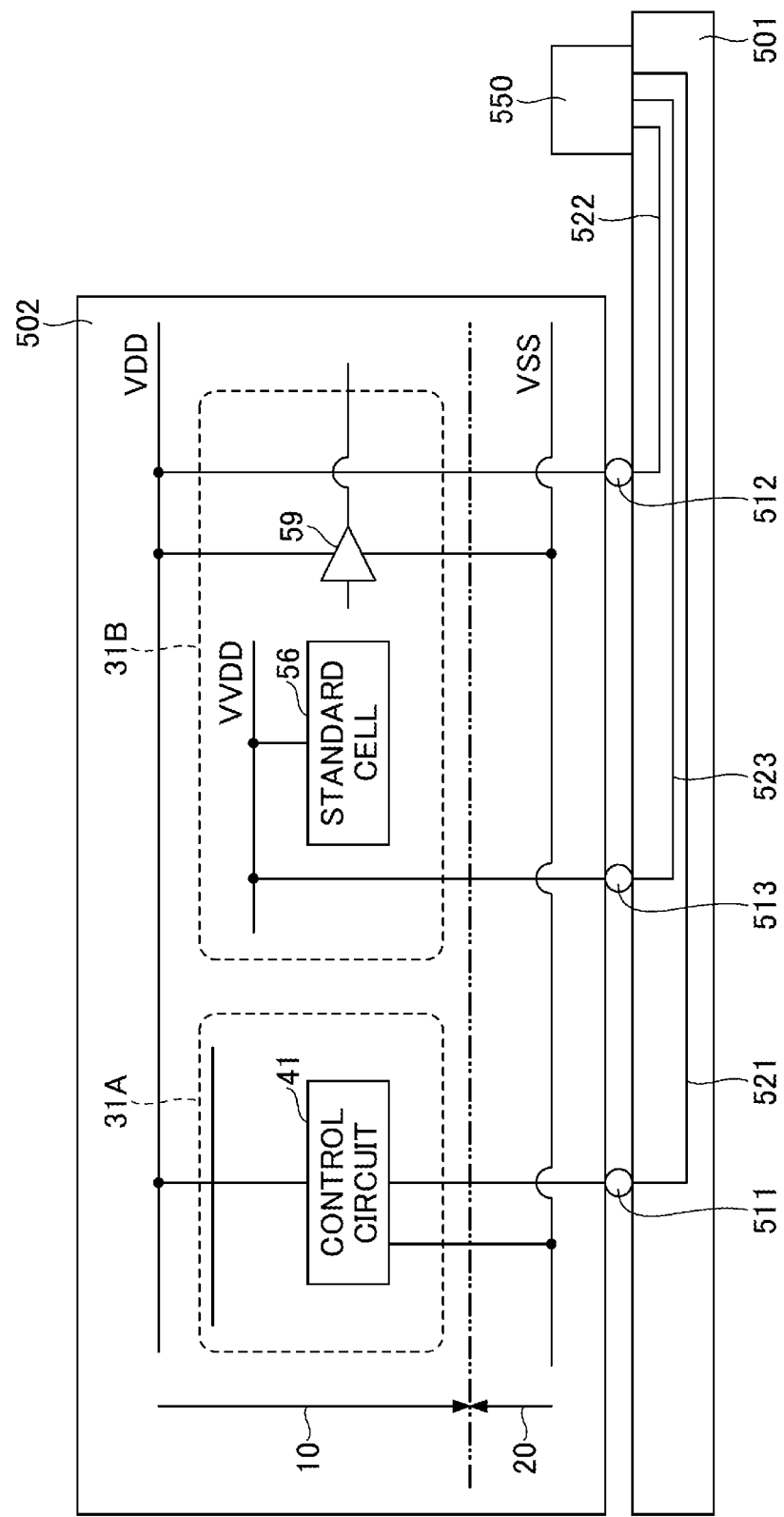
FIG. 31 is a schematic diagram showing the semiconductor device according to a fifth embodiment.

Next, a fifth embodiment will be described. The fifth embodiment differs from the first embodiment, etc. in terms of the arrangement of the switch transistors. FIG. 31 is a schematic diagram showing the semiconductor device according to the fifth embodiment.

In the fifth embodiment, on a mounting substrate 501, a semiconductor device 502 is mounted through a bump 511 for the control signal line, a bump 512 for the VDD wiring, and a bump 513 for the VVDD wiring. The mounting substrate 501 is provided with a control signal line 521 with one end connected to the bump 511, a VDD wiring 522 with one end connected to the bump 512, and a VVDD wiring 523 with one end connected to the bump 513. The switch transistor 550 connected to the other end of the control signal line 521, to the other end of the VDD wiring 522, and to the other end of the VVDD wiring 523 is mounted on the mounting substrate 501.

The semiconductor device 502 includes the first chip 10 and the second chip 20. The first chip 10 includes, for example, the control circuit 41, the standard cell 56, and a buffer 59. The control circuit 41 is provided in the first power domain 31A. The standard cell 56 and the buffer 59 are provided in the second power domain 31B. The buffer 59 has the same configuration as the buffers 51, 52, 60, and the like, and the power supply potential of the VSS and the power supply potential of the VDD are supplied to the buffer 59 through the vias provided in the second wiring layer 22 and the substrate 11 (omitted in FIG. 31).

In this way, the switch transistor is not to be included in the second wiring layer. That is, the semiconductor device may not include the switch transistor and the switch transistor may be provided outside the semiconductor device. For example, the switch transistor may be provided in another semiconductor device.

Figure 32:
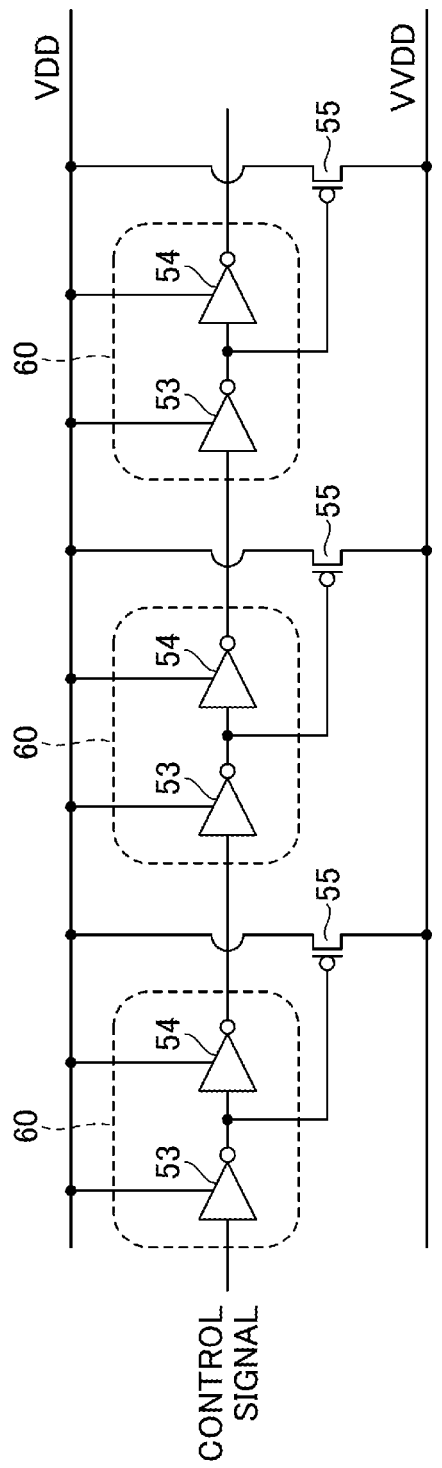
FIG. 32 is a circuit diagram showing a first example of correspondence of a switch transistor and a drive buffer.
Figure 33:
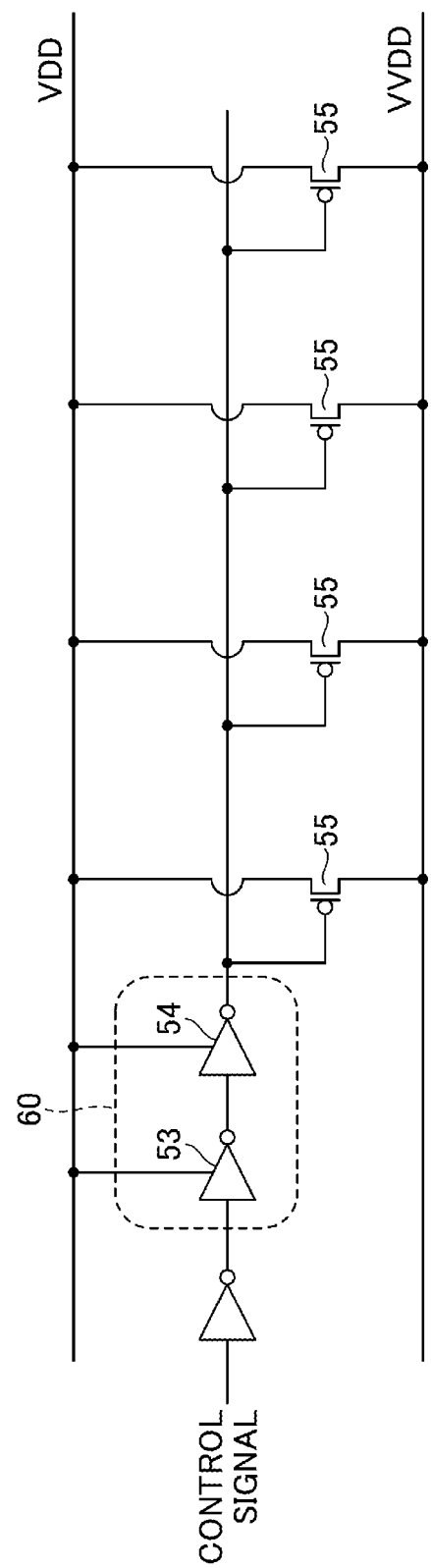
FIG. 33 is a circuit diagram showing a second example of correspondence of a switch transistor and a drive buffer.
Figure 34:
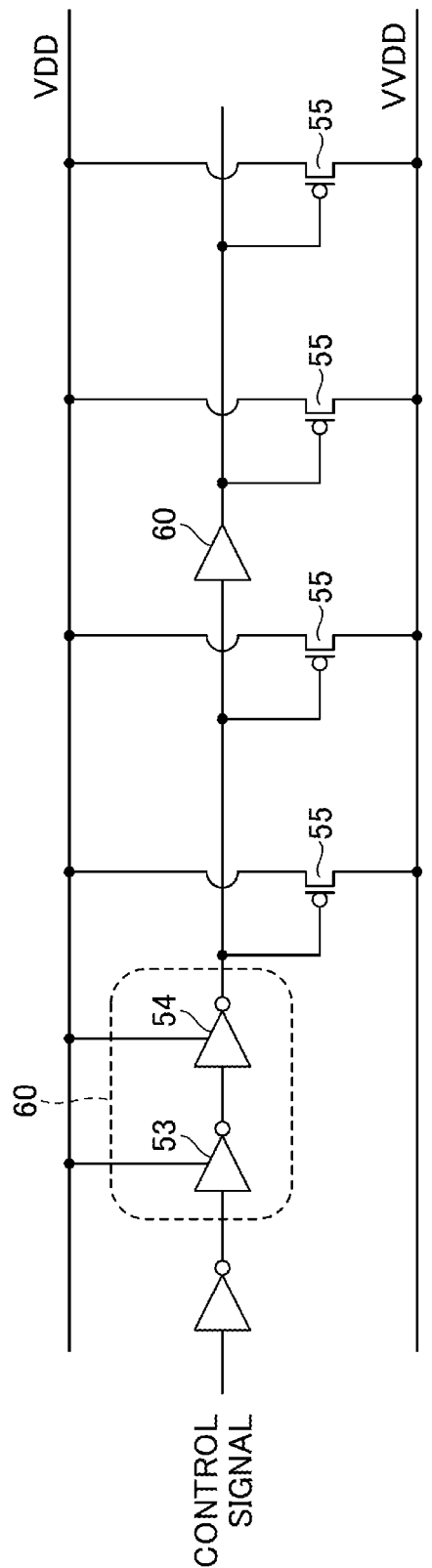
FIG. 34 is a circuit diagram showing a third example of correspondence of a switch transistor and a drive buffer.

One buffer (drive buffer) is not to be provided for each switch transistor to drive the switch transistor. FIG. 32 is a circuit diagram showing a first example of correspondence of the switch transistor and the drive buffer. FIG. 33 is a circuit diagram showing a second example of the correspondence of the switch transistor and the drive buffer. FIG. 34 is a circuit diagram showing a third example of the correspondence of the switch transistor and the drive buffer.

In the first example, as shown in FIG. 32, one drive buffer 60 is provided so as to correspond to one switch transistor 55.

In the second example, as shown in FIG. 33, one drive buffer 60 is provided so as to correspond to the plurality of switch transistors 55.

In the third example, one drive buffer 60 is provided so as to correspond to the plurality of switch transistors 55, and furthermore, the plurality of groups thereof is provided.

Although the invention has been described based on each of the embodiments in the above, the invention is not limited to the requirements described in the embodiments above. These aspects can be changed to the extent that they do not detract from the main purpose of the invention, and can be determined appropriately according to the applied form.

What is claimed is:

1. A semiconductor device comprising:
   a first chip having a substrate and a first wiring layer formed on a first surface of the substrate; and
   a second wiring layer formed on a second surface of the substrate opposite to the first surface of the substrate;
   wherein the second wiring layer includes
   a first power supply line to which a first power supply potential is supplied, and
   a second power supply line to which a second power supply potential is supplied;
   wherein the first chip includes
   a first ground line,
   a third power supply line to which the first power supply potential is supplied,
   a fourth power supply line to which the second power supply potential is supplied,
   one or more vias formed in the substrate and connecting the first power supply line and the third power supply line,
   a first area in which the first ground line and the fourth power supply line are arranged, and
   a first circuit connected between the first ground line and the third power supply line;
   wherein a switch is connected between the first power supply line and the second power supply line; and
   wherein, in a plan view, the third power supply line, the one or more vias, and the first circuit are arranged in the first area.

2. The semiconductor device according to claim 1, wherein the second wiring layer includes the switch.

3. The semiconductor device according to claim 1, wherein the first circuit is connected to a control terminal of the switch.

4. The semiconductor device according to claim 3, wherein the fourth power supply line includes
   a first power supply line strip provided on a first straight line extending in a first direction, and
   a second power supply line strip provided on the first straight line at a distance from the first power supply line strip; and
   wherein the third power supply line is arranged between the first power supply line strip and the second power supply line strip at a distance from the first power supply line strip and the second power supply line strip.

5. The semiconductor device according to claim 3, wherein the fourth power supply line includes
   a first power supply line strip provided on a first straight line extending in a first direction, and
   a second power supply line strip provided on the first straight line at a distance from the first power supply line strip; and
   wherein the first chip includes a connection provided between the first power supply line strip and the second power supply line strip at a distance from the first power supply line strip and the second power supply line strip, and connected between the first circuit and the control terminal.

6. The semiconductor device according to claim 3, wherein the fourth power supply line includes
   a first power supply line strip provided on a first straight line extending in a first direction, and
   a second power supply line strip provided on the first straight line at a distance from the first power supply line strip;
   wherein the third power supply line is arranged between the first power supply line strip and the second power supply line strip at a distance from the first power supply line strip and the second power supply line strip; and
   wherein the first chip includes a connection provided between the first power supply line strip and the second power supply line strip at a distance from the first power supply line strip and the second power supply line strip, and connected between the first circuit and the control terminal.

7. The semiconductor device according to claim 1, wherein the first chip includes
   a third ground line,
   a fifth power supply line connected to the first power supply line, and
   a second area in which the third ground line and the fifth power supply line are arranged.

8. The semiconductor device according to claim 7, comprising a second circuit connected between the third ground line and the fifth power supply line, and connected to the first circuit.

9. The semiconductor device according to claim 1, wherein the first chip includes
   a sixth power supply line to which a third power supply potential is supplied and
   a third circuit connected between the first ground line and the sixth power supply line; and
   wherein the third circuit is arranged in the first area in a plan view.

10. The semiconductor device according to claim 9, wherein the third power supply potential is equal to the first power supply potential.

11. The semiconductor device according to claim 9, wherein the third power supply potential is different from the first power supply potential.

12. The semiconductor device according to claim 1, wherein the switch includes
- a semiconductor layer connected to the first power supply line and the second power supply line,
- a gate electrode, and
- a gate insulating film provided between the semiconductor layer and the gate electrode.

13. The semiconductor device according to claim 12,
wherein the gate insulating film is formed on a surface of the semiconductor layer that faces the first chip; and
wherein the gate electrode is formed on a surface of the gate insulating film that faces the first chip.

14. The semiconductor device according to claim 12,
wherein the gate insulating film is formed on a surface of the semiconductor layer opposite a surface of the semiconductor layer that faces the first chip; and
wherein the gate electrode is formed on a surface of the gate insulating film opposite a surface of the gate insulating film that faces the first chip.

15. The semiconductor device according to claim 1, further comprising a mounting substrate on which the first chip and the second wiring layer are mounted;
wherein the switch is arranged on the mounting substrate at a position different from positions of the first chip and the second wiring layer.

16. The semiconductor device according to claim 3, further comprising a plurality of said switches;
wherein the first circuit is connected to a control terminal of each of the plurality of switches.

17. The semiconductor device according to claim 3, further comprising a plurality of said switches and a plurality of said first circuits;
wherein the plurality of first circuits are connected to respective control terminals of the plurality of switches.

* * * * *